(12) United States Patent
Negishi et al.

(10) Patent No.: US 11,575,076 B2
(45) Date of Patent: Feb. 7, 2023

(54) METHOD FOR MANUFACTURING THERMOELECTRIC CONVERSION MODULE, THERMOELECTRIC CONVERSION MODULE, AND BINDER FOR THERMOELECTRIC CONVERSION MODULE

(71) Applicant: HITACHI CHEMICAL COMPANY, LTD., Tokyo (JP)

(72) Inventors: Motohiro Negishi, Tokyo (JP); Yuki Kawana, Tokyo (JP); Dai Ishikawa, Tokyo (JP); Chie Sugama, Tokyo (JP); Hideo Nakako, Tokyo (JP); Yoshinori Ejiri, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 180 days.

(21) Appl. No.: 16/758,166

(22) PCT Filed: Oct. 24, 2018

(86) PCT No.: PCT/JP2018/039507
§ 371 (c)(1),
(2) Date: Apr. 22, 2020

(87) PCT Pub. No.: WO2019/082932
PCT Pub. Date: May 2, 2019

(65) Prior Publication Data
US 2020/0295248 A1     Sep. 17, 2020

(30) Foreign Application Priority Data

Oct. 24, 2017  (JP) .............................. JP2017-205096

(51) Int. Cl.
*H01L 35/34* (2006.01)
*C22C 5/02* (2006.01)
(Continued)

(52) U.S. Cl.
CPC ................ *H01L 35/34* (2013.01); *C22C 5/02* (2013.01); *C22C 5/04* (2013.01); *C22C 5/06* (2013.01); *C22C 19/03* (2013.01); *H01L 35/08* (2013.01)

(58) Field of Classification Search
CPC .. H01L 35/34; C22C 5/02; C22C 5/04; C22C 5/06
See application file for complete search history.

(56) References Cited

U.S. PATENT DOCUMENTS

| | | | |
|---|---|---|---|
| 2013/0087180 A1* | 4/2013 | Stark | ........................ H01L 35/30 136/205 |
| 2014/0251403 A1* | 9/2014 | Ghoshal | .................. H01L 35/32 136/200 |
| 2019/0051807 A1* | 2/2019 | Okumura | ................ H01L 35/34 |

FOREIGN PATENT DOCUMENTS

| | | |
|---|---|---|
| JP | H9-293906 A | 11/1997 |
| JP | 2010-018832 A | 1/2010 |

(Continued)

OTHER PUBLICATIONS

Charles M. Hansen, "Hansen Solubility Parameters: A User's Handbook", CRC Press, 1999, pp. 168-195 (cited in specification).

(Continued)

*Primary Examiner* — Tae-Sik Kang
(74) *Attorney, Agent, or Firm* — Fitch, Even, Tabin & Flannery, LLP

(57) ABSTRACT

A method for manufacturing a thermoelectric conversion module of the present invention is a method for manufacturing a thermoelectric conversion module including a thermoelectric semiconductor part in which a plurality of p-type semiconductors and a plurality of n-type semiconductors are alternately arranged, and a high temperature side electrode bound to a binding surface of the p-type semiconductor and the n-type semiconductor on a high temperature heat source
(Continued)

side and a low temperature side electrode bound to a binding surface of the p-type semiconductor and the n-type semiconductor on a low temperature heat source side, which electrically connect the p-type semiconductor and the n-type semiconductor adjacent to each other in series, and includes a binding step of binding at least one of the high temperature side electrode and the low temperature side electrode, and the p-type semiconductor and the n-type semiconductor together, by sintering a binding layer containing metal particles, which is provided between the electrode and the semiconductor.

13 Claims, 4 Drawing Sheets

(51) Int. Cl.
*C22C 5/04* (2006.01)
*C22C 5/06* (2006.01)
*C22C 19/03* (2006.01)
*H01L 35/08* (2006.01)

(56) References Cited

FOREIGN PATENT DOCUMENTS

| JP | 2017-059698 A | 3/2017 | | |
|---|---|---|---|---|
| JP | 2017-098282 A | 6/2017 | | |
| TW | 201729438 A | 8/2017 | | |
| WO | WO-2017086043 A1 * | 5/2017 | ............... | B22F 3/10 |

OTHER PUBLICATIONS

Katsuhiro Ueda, Sumio Inafuku, Iwao Mori, "Obtainment of Sectional Area of Stearic Acid Molecule—Experimental Value and Calculated Value--", Chemistry & Education, 1992, vol. 40 No. 2, p. 114-p. 117 (cited in specification).

* cited by examiner

METHOD FOR MANUFACTURING THERMOELECTRIC CONVERSION MODULE, THERMOELECTRIC CONVERSION MODULE, AND BINDER FOR THERMOELECTRIC CONVERSION MODULE

CROSS-REFERENCE TO RELATED APPLICATIONS

This application is a U.S. national phase application filed under 35 U.S.C. § 371 of International Application No. PCT/JP2018/039507, filed Oct. 24, 2018, designating the United States, which claims priority from Japanese Patent Application 2017-205096, filed Oct. 24, 2017, which are hereby incorporated herein by reference in their entirety.

TECHNICAL FIELD

The present invention relates to a method for manufacturing a thermoelectric conversion module, a thermoelectric conversion module, and a binder for a thermoelectric conversion module.

BACKGROUND ART

A power generating system of a thermoelectric conversion module using a thermoelectric semiconductor of a p-type semiconductor and an n-type semiconductor as a thermoelectric conversion material has a simple structure and no movable part, and thus, has high reliability and easy maintenance and inspection. It is expected that such a power generating system is used in a small-scale dispersion type power generating system using an exhaust heat source such as a refuse incinerator or a cogeneration system, and an on-vehicle power generating system using the heat of exhaust gas of a vehicle or the like, and it is desirable that a power generation unit price is reduced and the durability of a thermoelectric conversion system is improved, from the viewpoint of the current environmental countermeasures.

The thermoelectric conversion module, for example, includes electrodes containing copper or the like, which are bound to both sides of the thermoelectric semiconductor, electric insulating layers containing mica or the like, which are provided on the other surfaces of the electrodes, and a high temperature side heat source and a low temperature side heat source laminated on each of the electric insulating layers (for example, refer to Patent Literature 1 described below). In the thermoelectric conversion system including such a thermoelectric conversion module, the air is blown in the low temperature side heat source, and exhaust gas or the like at a high temperature is supplied to the high temperature side heat source, and thus, a temperature difference can be provided on both ends of the thermoelectric conversion element, a thermoelectric force can be generated in the thermoelectric conversion element by the temperature difference, and a direct current can be taken out from the electrode.

CITATION LIST

Patent Literature

Patent Literature 1: Japanese Unexamined Patent Publication No. H9-293906

SUMMARY OF INVENTION

Technical Problem

In general, in the thermoelectric conversion module having the configuration described above, the thermoelectric semiconductor and the high temperature side electrode or the low temperature side electrode are bound together by a binder such as a brazing material and a solder. An electromotive force of the thermoelectric conversion module is proportional to a temperature difference in the thermoelectric semiconductor that is generated between the high temperature side electrode and the low temperature side electrode. For this reason, heat conduction properties of the binder also affect the temperature difference in the thermoelectric semiconductor, that is, power generation performance. A heat conductivity of the binder such as the brazing material or the solder may be lower than that of the electrode, in accordance with the material of the electrode, and in this case, there is a possibility that a decrease in the power generation performance is caused.

In addition, in general, a thermal expansion coefficient is different between the electrode and the thermoelectric semiconductor, and thus, a thermal expansion difference easily occurs between the electrode and the thermoelectric semiconductor. The thermoelectric semiconductor is a brittle material, and thus, in a case where a large thermal expansion difference occurs between the electrode and the thermoelectric semiconductor at the time of binding or operating, there is a possibility that the breakage of the thermoelectric semiconductor is caused and a circuit is disconnected. The brazing material and the solder have a small stress absorption effect, and thus, it is difficult to suppress the problems described above.

Further, in a case where a variation occurs in the position of a binding surface of the thermoelectric semiconductor with respect to the electrode or in a distance between the electrodes, due to a variation in the length of the thermoelectric semiconductor, a surface pressure distribution occurs at the time of pressurizing the electrode, the thermoelectric semiconductor, and the like in the binding, and thus, cohesiveness is degraded. In a case where the cohesiveness between the thermoelectric semiconductor and the electrode is degraded, a contact thermal resistance increases, and an electric conductivity decreases, and thus, the power generation performance decreases. In general, in order to sufficiently ensure the cohesiveness between the thermoelectric semiconductor and the electrode, assembly is performed by using a thermoelectric semiconductor that is selected such that a variation in the length is approximately less than or equal to 10 μm, and an electrode having small modification and small surface roughness. As described above, in a case where there is a variation in the length of the thermoelectric semiconductor, a manufacturing cost easily increases due to a selecting operation, or in accordance to a case, additional processing such as processing for adjusting the position (the height) of the binding surface.

The present invention has been made in consideration of the circumstances described above, and an object thereof is to provide a method for manufacturing a thermoelectric conversion module in which it is possible to manufacture a thermoelectric conversion module excellent in power generation performance and heat stress properties with excellent productivity even in a case where there is a variation in the length of a thermoelectric semiconductor, a thermoelectric conversion module excellent in power generation performance and heat stress properties, and a binder for a thermoelectric conversion module used therein.

Solution to Problem

In order to attain the object described above, the present invention provides a method for manufacturing a thermoelectric conversion module including a thermoelectric semiconductor part in which a plurality of p-type semiconductors and a plurality of n-type semiconductors are alternately arranged, and a high temperature side electrode bound to a binding surface of the p-type semiconductor and the n-type semiconductor on a high temperature heat source side and a low temperature side electrode bound to a binding surface of the p-type semiconductor and the n-type semiconductor on a low temperature heat source side, which electrically connect the p-type semiconductor and the n-type semiconductor adjacent to each other in series, the method including: a binding step of binding at least one of the high temperature side electrode and the low temperature side electrode, and the p-type semiconductor and the n-type semiconductor together, by sintering a binding layer containing metal particles, which is provided between the electrode and the semiconductor, in which the binding layer is formed of a binder containing copper particles as the metal particles.

The manufacturing method according to the present invention, it is possible to reduce a thermal resistance compared to a brazing material, and to obtain a thermoelectric conversion module excellent in power generation performance, by sintering the binding layer containing the copper particles. In addition, the sintered binding layer is formed of a porous body, and thus, it is possible to reduce a stress that is generated due to a thermal expansion difference between the thermoelectric semiconductor and the electrode at the time of binding or operating. Further, the binding layer has shape followability, and thus, even in a case where there is a variation in the length of the thermoelectric semiconductor, it is possible to sufficiently obtain cohesiveness between the thermoelectric semiconductor and the electrode. Accordingly, it is possible to improve a yield ratio of the thermoelectric conversion module.

In addition, the thermoelectric conversion module obtained by the manufacturing method according to the present invention includes a sintered body that is formed by sintering the binding layer containing the copper particles, and thus, can be used in a temperature range of a −50° C. to 1085° C. that is a melting point of copper. According to the manufacturing method according to the present invention, it is possible to manufacture a thermoelectric conversion module that can be used even in a high temperature environment of higher than or equal to 300° C., which is difficult in solder binding.

In the binding step described above, the binding layer can be sintered under a load of 0 MPa to 100 MPa.

The binding layer may be formed of a coating film of the binder having a thickness of 10 μm to 1000 μm, from the viewpoint of a stress relaxation effect, an effect of absorbing a variation in the length of the thermoelectric semiconductor or a variation in a distance between the electrodes, and a printing accuracy. In a case where the thickness of the coating film is greater than or equal to 10 μm, the stress relaxation effect is easily obtained, and in a case where the thickness is less than or equal to 1000 μm, the printing accuracy is easily ensured.

In the manufacturing method according to the present invention, a variation in the length of the p-type semiconductor and the n-type semiconductor in a current direction before binding may be 10 μm to 200 μm. Even in a case where there is a variation in the length of the thermoelectric semiconductor, it is possible to sufficiently obtain the cohesiveness between the thermoelectric semiconductor and the electrode by the binding layer having the shape followability. In addition, it is easy to adjust the height of the thermoelectric conversion module after binding to be in a predetermined range. Accordingly, it is possible to improve the yield ratio of the thermoelectric conversion module, and to reduce the cost of the thermoelectric conversion module.

In the manufacturing method according to the present invention, a part or all of at least one surface of the binding surface of the p-type semiconductor and the n-type semiconductor with respect to the high temperature side electrode and the low temperature side electrode, and a binding surface of the high temperature side electrode and the low temperature side electrode with respect to the p-type semiconductor and the n-type semiconductor may include a metal diffusion prevention layer.

The metal diffusion prevention layer is provided, and thus, it is possible to prevent a decrease in the power generation performance due to the diffusion of metal components contained in the thermoelectric semiconductor.

The binder is capable of further containing a dispersion medium.

The binder is capable of containing a solvent having a boiling point of higher than or equal to 300° C. by greater than or equal to 2 mass % on the basis of a total mass of the binder or greater than or equal to 15 volume % on the basis of a total volume of the binder, as the dispersion medium.

The binder is capable of containing submicrocopper particles having a volume average particle diameter of greater than or equal to 0.12 μm and less than or equal to 0.8 μm by greater than or equal to 30 mass % and less than or equal to 90 mass % on the basis of a total mass of the metal particles, as the copper particles.

The binder is capable of containing flaky microcopper particles having a volume average particle diameter of greater than or equal to 2 μm and less than or equal to 50 μm and an aspect ratio of greater than or equal to 3.0 by greater than or equal to 10 mass % and less than or equal to 50 mass % on the basis of the total mass of the metal particles, as the copper particles.

The binder may contain other particles in addition to the copper particles, as the metal particles, and the other particles contain at least one type of metal selected from the group consisting of zinc, nickel, silver, gold, palladium, and platinum.

In the manufacturing method according to the present invention, a sintered body having a volume resistivity, a heat conductivity, and a binding strength of less than or equal to $1 \times 10^{-5}$ Ω·cm, greater than or equal to 50 W·m$^{-1}$·K$^{-1}$, and greater than or equal to 20 MPa, respectively, can be formed by heating the binding layer at lower than or equal to 350° C. in hydrogen having a concentration of greater than or equal to 1%.

In addition, the present invention provides a thermoelectric conversion module, including: a thermoelectric semiconductor part in which a plurality of p-type semiconductors and a plurality of n-type semiconductors are alternately arranged; and a high temperature side electrode bound to a binding surface of the p-type semiconductor and the n-type semiconductor on a high temperature heat source side and a low temperature side electrode bound to a binding surface of the p-type semiconductor and the n-type semiconductor on a low temperature heat source side, which electrically connect the p-type semiconductor and the n-type semiconductor adjacent to each other in series, in which the thermoelectric conversion module further includes a binding portion in which at least one of the high temperature side electrode and the low temperature side electrode, and the p-type semiconductor and the n-type semiconductor are bound together, and the binding portion includes a sintered body of a binder containing copper particles.

In addition, the present invention provides a binder for a thermoelectric conversion module used for binding a thermoelectric semiconductor and an electrode together, which are provided in the thermoelectric conversion module, the binder containing: metal particles, in which the metal particles include copper particles.

The binder for a thermoelectric conversion module is capable of further containing: a dispersion medium.

The binder for a thermoelectric conversion module is capable of containing a solvent having a boiling point of higher than or equal to 300° C. by greater than or equal to 2 mass % on the basis of a total mass of the binder or greater than or equal to 15 volume % on the basis of a total volume of the binder, as the dispersion medium.

The binder for a thermoelectric conversion module is capable of containing submicrocopper particles having a volume average particle diameter of greater than or equal to 0.12 μm and less than or equal to 0.8 μm by greater than or equal to 30 mass % and less than or equal to 90 mass % on the basis of a total mass of the metal particles, as the copper particles.

The binder for a thermoelectric conversion module is capable of containing flaky microcopper particles having a volume average particle diameter of greater than or equal to 2 μm and less than or equal to 50 μm and an aspect ratio of greater than or equal to 3.0 by greater than or equal to 10 mass % and less than or equal to 50 mass % on the basis of the total mass of the metal particles, as the copper particles.

In the binder for a thermoelectric conversion module, the metal particles may include other particles in addition to the copper particles, and the other particles may contain at least one type of metal selected from the group consisting of zinc, nickel, silver, gold, palladium, and platinum.

Advantageous Effects of Invention

According to the present invention, it is possible to provide a method for manufacturing a thermoelectric conversion module in which it is possible to manufacture a thermoelectric conversion module excellent in power generation performance and heat stress properties with excellent productivity even in a case where there is a variation in the length of a thermoelectric semiconductor, a thermoelectric conversion module excellent in power generation performance and heat stress properties, and a binder for a thermoelectric conversion module used therein.

DESCRIPTION OF EMBODIMENTS

Herein, unless otherwise noted, one type of materials to be exemplified can be independently used or two or more types thereof can be used by being combined. In a case where there are a plurality of substances corresponding to each component in a binder, unless otherwise noted, the content of each of the components in the binder indicates a total amount of the plurality of substances existing in the binder. A numerical range represented by using "to" indicates a range including numerical numbers described before and after "to" as a minimum value and a maximum value. Herein, in a numerical range described in step by step in a stepwise manner, an upper limit value or a lower limit value of a numerical range in a certain step may be replaced with an upper limit value or a lower limit value of a numerical range in the other step. In addition, herein, in a numerical range, an upper limit value or a lower limit value of the numerical range may be replaced with a value represented in examples. The term "layer" includes not only a structure that is formed on the entire surface but also a structure that is formed on a part of the surface, when observed as a plan view.

Hereinafter, embodiments of the present invention will be described in detail. However, the present invention is not limited to the following embodiments.

A thermoelectric conversion module of this embodiment is a thermoelectric conversion module, including: a thermoelectric semiconductor part in which a plurality of p-type semiconductors and a plurality of n-type semiconductors are alternately arranged; and a high temperature side electrode bound to a binding surface of the p-type semiconductor and the n-type semiconductor on a high temperature heat source side and a low temperature side electrode bound to a binding surface of the p-type semiconductor and the n-type semiconductor on a low temperature heat source side, which electrically connect the p-type semiconductor and the n-type semiconductor adjacent to each other in series, and the thermoelectric conversion module further includes: a binding portion in which at least one of the high temperature side electrode and the low temperature side electrode, and the p-type semiconductor and the n-type semiconductor are bound together, in which the binding portion includes a sintered body of a binder containing copper particles.

A method for manufacturing a thermoelectric conversion module of this embodiment, includes: a binding step of binding at least one of the high temperature side electrode and the low temperature side electrode, and the p-type semiconductor and the n-type semiconductor together, by sintering a binding layer containing metal particles, which is provided between the electrode and the semiconductor, in which the binding layer is formed of a binder containing copper particles as the metal particles.

Hereinafter, this embodiment will be described with reference to the drawings.

(1) First Embodiment

Figure 1:
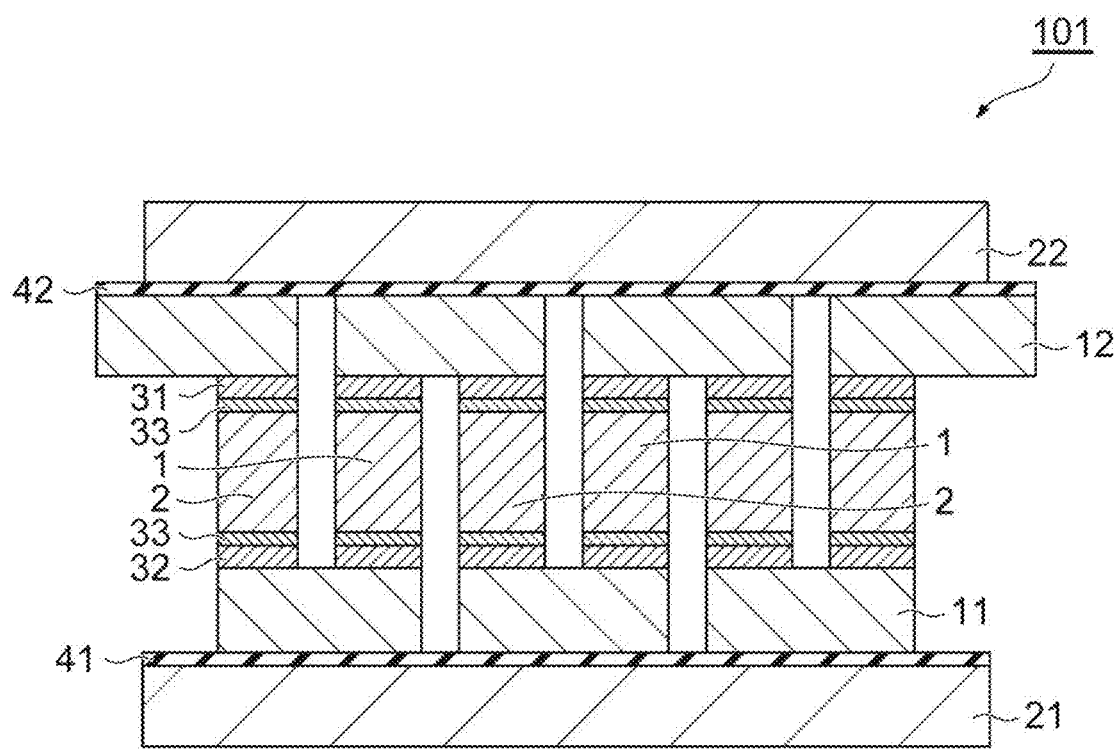
FIG. 1 is a schematic sectional view illustrating one embodiment of a thermoelectric conversion module.

FIG. 1 is a schematic sectional view illustrating one embodiment of a thermoelectric conversion module. A thermoelectric conversion module 101 illustrated in FIG. 1, a high (low) temperature side heat source 21 and a low (high) temperature side heat source 22 facing each other, a thermoelectric semiconductor part provided between the heat sources, in which a plurality of p-type semiconductors 1 and a plurality of n-type semiconductors 2 that are arranged by being separated from each other, and electrodes 11 and 12 bound to the p-type semiconductor 1 and the n-type semiconductor 2 on both end sides by binding portions 31 and 32. In the thermoelectric conversion module 101, the p-type semiconductor 1 and the n-type semiconductor 2 are alternately arranged, and connected in series by the electrodes 11 and 12. A metal diffusion prevention layer 33 is provided on a binding surface of the p-type semiconductor 1 and the n-type semiconductor 2.

In addition, in the thermoelectric conversion module 101, a high (low) temperature side insulating layer 41 and a low (high) temperature side insulating layer 42 are provided between the high (low) temperature side heat source 21 and the electrode 11 and between the low (high) temperature side heat source 22 and the electrode 12, respectively. Note that, an installation range of the insulating layer may be the entire heat source or only a portion abutting on the electrode.

Examples of the material of the electrodes 11 and 12 include copper, aluminum, nickel, molybdenum, titanium, stainless steel, gold, silver, platinum, and the like, from the viewpoint of heat conduction properties and conductive properties.

In the electrodes 11 and 12, it is preferable that a metallization layer is provided on a binding surface of the binding portions 31 and 32. Examples of the material of the metallization layer include nickel, gold, silver, titanium, tungsten, molybdenum, and the like. The metallization layer, for example, can be formed by a method such as plating, sputtering, or vapor deposition. The thickness of the metallization layer can be 0.05 µm to 500 µm.

Examples of the p-type semiconductor 1 and the n-type semiconductor 2 include a silicon-germanium-based semiconductor, a magnesium-silicon-based semiconductor, a manganese-silicon-based semiconductor, a bismuth-tellurium-based semiconductor, a lead-tellurium-based semiconductor, an iron-vanadium-aluminum-based semiconductor, a cobalt-antimony-based semiconductor, and the like.

It is preferable that the metal diffusion prevention layer 33, for example, contains Ni, Mo, Ti, TiN, Al, and the like. The thickness of the metal diffusion prevention layer 33 can be 0.01 µm to 100 µm.

In the thermoelectric conversion module of this embodiment, it is preferable that a buffer layer is provided between the high (low) temperature side heat source 21 and the high (low) temperature side insulating layer 41 or between the low (high) temperature side heat source 22 and the low (high) temperature side insulating layer 42.

It is preferable that the buffer layer is in the shape of a sheet, from the viewpoint of processing easiness. However, a greasy buffer layer can also be used. A material that can be subjected to plastic deformation or elastic deformation between the high (low) temperature side heat source 21 or the low (high) temperature side heat source 22 and the electrodes 11 and 12, and a material having heat resistance with respect to an operation temperature are preferable as the material of the sheet-like buffer layer. Examples of such a material include a carbon sheet, a metal fiber, a ceramic fiber, a porous body, and rubber.

In a case where the buffer layer is an insulating material, the insulating layer 41(42) may not be provided between the buffer layer and the high (low) temperature side heat source 21 or the low (high) temperature side heat source 22 abutting on the buffer layer, or between the buffer layer and the electrodes 11 and 12.

Further, in a case where the thermoelectric conversion module is used at a low temperature in which the heat source is lower than or equal to 200° C., for example, a resin film or a resin tape such as a polyimide film, a polyimide tape, and a polytetrafluoroethylene sheet can also be used.

In addition, it is preferable that the material of the metal fiber and the porous body contains copper, aluminum, nickel, molybdenum, or the like that has high heat conduction properties and is easily deformed.

In this embodiment, the binding portions 31 and 32 provided between the electrode 11 and the p-type semiconductor 1 and the n-type semiconductor 2 or between the electrode 12 and the p-type semiconductor 1 and the n-type semiconductor 2 includes a sintered body of a binder (a copper paste) containing copper particles. The details of the binder (the copper paste) will be described below.

For example, the electrode or the p-type semiconductor and the n-type semiconductor abuts on a coating film that is formed by applying the binder onto a binding position of the electrode 11 with respect to the p-type semiconductor 1 and the n-type semiconductor 2 or the binding surface of the p-type semiconductor 1 and the n-type semiconductor 2, and as necessary, by drying the binder, as necessary by using a jig, and the coating film (a binding layer) is burned, and thus, the binding portions 31 and 32 can be formed.

Stencil printing, a dispenser, screen printing, transfer printing, offset printing, a jet printing method, a jet dispenser, a needle dispenser, a comma coater, a slit coater, a die coater, a gravure coater, slit coating, anastatic printing, intaglio printing (gravure printing), soft lithography, bar coating, an applicator, a particle deposition method, a spray coater, a spin coater, a dip coater, electrodeposition coating, and the like can be used as a method of applying the binder.

As a printing dimension in the binding surface of the thermoelectric semiconductor, it is preferable that printing is performed in a region of greater than or equal to 80% and less than or equal to 120% with respect to the area of an end surface.

The thickness of the coating film may be greater than or equal to 1 µm and less than or equal to 1000 µm, may be greater than or equal to 10 µm and less than or equal to 1000 µm, may be greater than or equal to 10 µm and less than or equal to 500 µm, may be greater than or equal to 50 µm and less than or equal to 200 µm, may be greater than or equal to 10 µm and less than or equal to 3000 µm, may be greater than or equal to 15 µm and less than or equal to 500 µm, may be greater than or equal to 20 µm and less than or equal to 300 µm, may be greater than or equal to 5 µm and less than or equal to 500 µm, may be greater than or equal to 10 µm and less than or equal to 250 µm, or may be greater than or equal to 15 µm and less than or equal to 150 µm.

It is preferable that the thickness of the coating film is greater than or equal to 10 µm and less than or equal to 1000 µm, from the viewpoint of a stress relaxation effect, an effect of absorbing a variation in the length of the thermoelectric semiconductor or a variation in a distance between the electrodes, and a printing accuracy. In a case where the thickness of the coating film is greater than or equal to 10 µm, the stress relaxation effect is easily obtained, and in a case where the thickness is less than or equal to 1000 µm, the printing accuracy is easily ensured.

As a drying method of the coating film, the coating film may be dried by being left to stand at a normal temperature, may be subjected to heating drying, or may be subjected to reduced-pressure drying. In the heating drying or the reduced-pressure drying, for example, a hot plate, a hot air drying machine, a hot air heating furnace, a nitrogen drying machine, an infrared drying machine, an infrared heating furnace, a far-infrared heating furnace, a microwave heating device, a laser heating device, an electromagnetic heating device, a heater heating device, a vapor heating furnace, a hot plate press device, and the like can be used. A drying temperature and a drying time may be suitably adjusted in accordance with the type and the amount of a dispersion medium that is used. As the drying temperature and the drying time, for example, the coating film may be dried at higher than or equal to 50° C. and lower than or equal to 180° C. for longer than or equal to 1 minute and shorter than or equal to 120 minutes.

The coating film (the binding layer) can be sintered by a heating treatment. In the heating treatment, for example, a hot plate, a hot air drying machine, a hot air heating furnace, a nitrogen drying machine, an infrared drying machine, an infrared heating furnace, a far-infrared heating furnace, a microwave heating device, a laser heating device, an electromagnetic heating device, a heater heating device, a vapor heating furnace, and the like can be used.

A gas atmosphere at the time of sintering may be an oxygen-free atmosphere, from the viewpoint of suppressing oxidation. The gas atmosphere at the time of sintering may be a reducing atmosphere, from the viewpoint of removing a surface oxide of the copper particles. Examples of the oxygen-free atmosphere include an atmosphere into which oxygen-free gas such as nitrogen and noble gas is introduced or a vacuum atmosphere. Examples of the reducing atmosphere include an atmosphere of pure hydrogen gas, an atmosphere of mixed gas of hydrogen and nitrogen as represented by forming gas, an atmosphere of nitrogen containing formic acid gas, an atmosphere of mixed gas of hydrogen and noble gas, an atmosphere of noble gas containing formic acid gas, and the like.

A highest achieving temperature at the time of the heating treatment may be higher than or equal to 200° C. and lower than or equal to 450° C., may be higher than or equal to 250° C. and lower than or equal to 450° C., may be higher than or equal to 250° C. and lower than or equal to 400° C., or may be higher than or equal to 250° C. and lower than or equal to 350° C., from the viewpoint of reducing a thermal damage with respect to a member configuring the thermoelectric conversion module and of improving a yield ratio. In a case where the highest achieving temperature is higher than or equal to 200° C., the sintering tends to be sufficiently performed when a highest achieving temperature retention time is shorter than or equal to 60 minutes. In addition, even in a case where the highest achieving temperature is lower than or equal to 250° C., and is preferably lower than or equal to 225° C., it is possible to obtain a sufficient binding strength by using a binder containing a specific amount of specific additive described below.

The highest achieving temperature retention time may be longer than or equal to 1 minute and shorter than or equal to 60 minutes, may be longer than or equal to 1 minute and shorter than 40 minutes, or may be longer than or equal to 1 minute and shorter than 30 minutes, from the viewpoint of volatilizing the entire dispersion medium and of improving the yield ratio.

In this embodiment, it is preferable that heating is performed at lower than or equal to 350° C. in hydrogen having a concentration of greater than or equal to 1%, from the viewpoint of reducing properties of a binder containing copper nanoparticles as a main component and a reduction in a heat stress generated between the electrode and the thermoelectric semiconductor.

In addition, the coating film (the binding layer) can be sintered under a load of 0 MPa to 100 MPa. Note that, in this embodiment, binding can be performed in a pressureless state. Herein, "pressureless" indicates a state of receiving the self-weight of a member to be bound, or a pressure of less than or equal to 0.01 MPa is received, in addition to the self-weight.

When the binder (the copper paste) contains the metal particles and the dispersion medium, the metal particles include submicrocopper particles having a volume average particle diameter of greater than or equal to 0.01 µm and less than or equal to 0.8 µm and microcopper particles having a volume average particle diameter of greater than or equal to 2.0 µm and less than or equal to 50 µm, a sum of the content of the submicrocopper particles and the content of the microcopper particles is greater than or equal to 80 mass % on the basis of a total mass of the metal particles, the content of the submicrocopper particles is greater than or equal to 30 mass % and less than or equal to 90 mass % on the basis of a sum of the mass of the submicrocopper particles and the mass of the microcopper particles, and the content of the microcopper particles is greater than or equal to 10 mass % and less than or equal to 50 mass % on the basis of a total mass of the total metal particles, it is possible to obtain a sufficient binding strength even in a case where binding is performed in a pressureless state.

It is considered that the reason of the above description is because it is possible to sufficiently suppress volume contraction at the time of sintering, due to a surface protective agent or the dispersion medium, while maintaining sufficient sintering properties, by containing the submicrocopper particles and the microcopper particles contained in the binder at a specific ratio, and a sintered body strength is ensured and a binding force with respect to a surface to be bound is improved.

In addition, it is possible to obtain the effect described above by the submicrocopper particles and the microcopper particles, and thus, the binder described above can be stably supplied at a lower price, compared to a binder containing expensive copper nanoparticles as a main component.

Further, it is preferable that the microcopper particles described above are flaky microcopper particles. In the case of using the flaky microcopper particles, a heat stress generated between the electrode and the thermoelectric semiconductor is more easily reduced. Note that, it is considered that the reason that such an effect is obtained is because the volume contraction at the time of sintering the binder can be suppressed by orienting the microcopper particles in the binder to be approximately parallel to the binding surface, the binding force is improved due to an increase in an overlapping area of the flaky microcopper particles, and a reinforcement effect is obtained by aligning the submicrocopper particles with the flaky microcopper particles.

The binder (the copper paste) after binding is a sintered body (a porous body) of copper.

In a case where the binding portions 31 and 32 are formed by using the binder containing the copper particles, that is, both end surfaces of the thermoelectric semiconductor are bound by the binder containing the copper particles, it is possible to form the thermoelectric conversion module in one binding step.

In addition, in a case where one of the binding portions 31 and 32 is formed by using a binder such as a brazing material or a solder, that is, the electrode 11 or 12 and the p-type semiconductor 1 and the n-type semiconductor 2 are bound together by the brazing material or the solder, first, a binding step of performing binding with the brazing material or the solder is performed, and then, a binding step of performing binding with the binder containing the copper particles is performed.

(2) Second Embodiment

Figure 2:
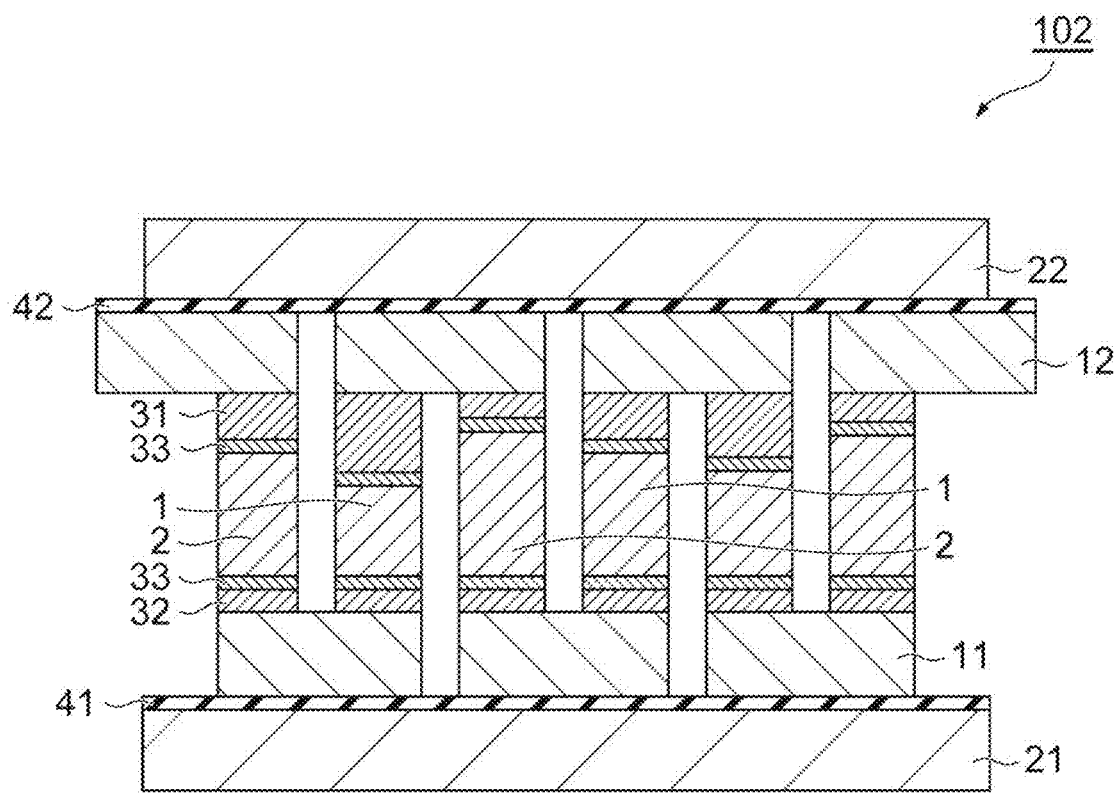
FIG. 2 is a schematic sectional view illustrating another embodiment of the thermoelectric conversion module.

FIG. 2 is a schematic sectional view illustrating another embodiment of the thermoelectric conversion module. A thermoelectric conversion module 102 illustrated in FIG. 2 is a state in which a variation occurs in the length of the p-type semiconductor 1 and the n-type semiconductor 2 that are a thermoelectric semiconductor, in a current direction, in the first embodiment of the thermoelectric conversion module described above. Note that, the length of the p-type semiconductor 1 and the n-type semiconductor 2 in the current direction can also be a variation in the height of the p-type semiconductor 1 and the n-type semiconductor 2 that are bound to or arranged on the electrode 11 positioned on the lower side, and can also be a variation in the position of the binding surface on the electrode 12 side.

In this case, a first binding step of binding in advance one of the electrodes 11 and 12, and the p-type semiconductor 1 and the n-type semiconductor 2 together can be performed, and as with the first embodiment described above, a second binding step of applying the binder containing the copper particles onto the binding surface of the p-type semiconductor 1 and the n-type semiconductor 2 or the binding position of the other of the electrodes 11 and 12 with respect to the p-type semiconductor 1 and the n-type semiconductor 2 can be performed.

In the second binding step according to this embodiment, it is preferable that the other of the electrodes 11 and 12, and the p-type semiconductor 1 and the n-type semiconductor 2 are pressurized in a direction approaching each other, and then, the binding layer is burned. In addition, the binding layer may be burned while pressurizing the other of the electrodes 11 and 12, and the p-type semiconductor 1 and the n-type semiconductor 2 in the direction approaching each other. By performing such pressurization, even in a case where there is a variation in the length of the p-type semiconductor 1 and the n-type semiconductor 2, it is possible to sufficiently obtain cohesiveness between the p-type semiconductor 1 and the n-type semiconductor 2, and the other of the electrodes 11 and 12 by the binding layer having shape followability. In addition, it is possible to reduce a variation in the height of the thermoelectric conversion module after binding.

In particular, in a case where a variation in the length of the p-type semiconductor 1 and the n-type semiconductor 2 is greater than or equal to 30 µm, it is possible to easily adjust the height of the thermoelectric conversion module to be in a predetermined range by performing the second binding step described above, and to reduce the cost of the thermoelectric conversion module.

It is preferable that a variation in the length of the p-type semiconductor 1 and the n-type semiconductor 2 is less than or equal to 200 µm, from the viewpoint of a processing accuracy and a shape retaining force of the binding portion 31. A variation in the length of the p-type semiconductor 1 and the n-type semiconductor 2 may be 10 µm to 200 µm, may be 100 µm to 200 µm, may be 10 µm to 50 µm, or may be 50 µm to 100 µm.

(3) Third Embodiment

Figure 3:
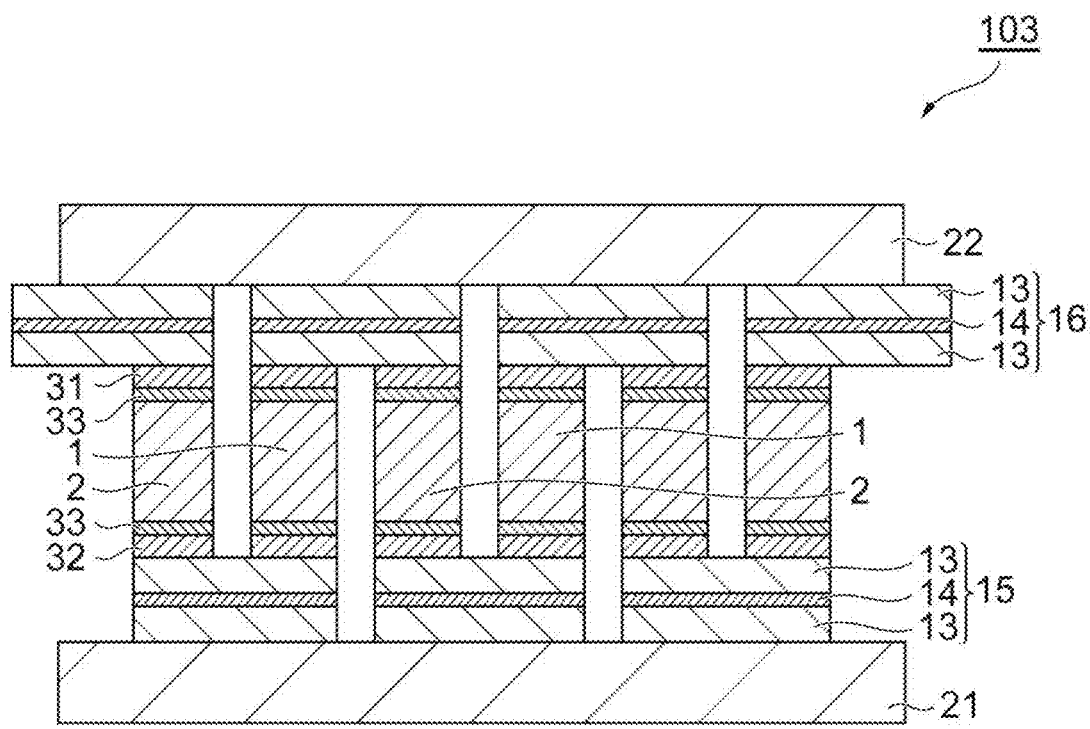
FIG. 3 is a schematic sectional view illustrating another embodiment of the thermoelectric conversion module.

FIG. 3 is a schematic sectional view illustrating another embodiment of the thermoelectric conversion module. A thermoelectric conversion module 103 illustrated in FIG. 3 has the same constituents as those in the first embodiment and the second embodiment described above, except that the electrodes of the thermoelectric conversion modules in FIG. 1 and FIG. 2 are changed to electrodes 15 and 16 with an insulating layer, and the high (low) temperature side insulating layer 41 and the low (high) temperature side insulating layer 42 are not provided. That is, in this embodiment, there may be a variation in the length of the p-type semiconductor 1 and the n-type semiconductor 2.

In the thermoelectric conversion module 103, it is possible to omit the high (low) temperature side insulating layer 41 and the low (high) temperature side insulating layer 42 described in the first embodiment described above by including the electrodes 15 and 16 with an insulating layer, and to simplify the structure of the thermoelectric conversion module.

Examples of the electrodes 15 and 16 with an insulating layer include an electrode having a laminated structure in which an insulating layer 14 is interposed between conductive layers 13. Examples of the material of the conductive layer 13 include copper, aluminum, nickel, molybdenum, and the like. Examples of the material of the insulating layer 14 include ceramic, a resin, glass, and the like, and ceramic is preferable from the viewpoint of heat resistance and contact thermal resistance.

(4) Binder (Copper Paste) Containing Copper Particles

The binder containing the copper particles that is used in the first embodiment, second embodiment, and the third embodiment described above will be described.

The binder of this embodiment contains the metal particles and the dispersion medium. Examples of the metal particles include copper particles, other metal particles in addition to the copper particles, and the like.

Examples of the copper particles include submicrocopper particles and microcopper particles. The submicrocopper particles indicate copper particles having a particle diameter of greater than or equal to 0.01 µm and less than 1.00 µm. The microcopper particles indicate copper particles having a particle diameter of greater than or equal to 1 µm and less than 50 µm.

The particle diameter of the copper particles can be obtained by the following method. The particle diameter of the copper particles, for example, can be calculated from an SEM image. A powder of the copper particles is placed on a carbon tape for SEM with a spatula, and is set to a sample for SEM. The sample for SEM is observed by an SEM device at a magnification of 5000 times. A square circumscribed the copper particles in the SEM image is plotted by image processing software, and one side thereof is set to a particle diameter of the particles.

(Submicrocopper Particles)

Examples of the submicrocopper particles include submicrocopper particles containing copper particles having a particle diameter of greater than or equal to 0.12 µm and less than or equal to 0.8 µm, and for example, copper particles having a volume average particle diameter of greater than or equal to 0.12 µm and less than or equal to 0.8 µm can be used as the submicrocopper particles. In a case where the volume average particle diameter of the submicrocopper particles is greater than or equal to 0.12 µm, an effect of suppressing a synthesis cost of the submicrocopper particles, an effect of excellent dispersibility, and an effect of suppressing a used amount of a surface treatment agent are easily obtained. In a case where the volume average particle diameter of the submicrocopper particles is less than or equal to 0.8 µm, an effect of excellent sintering properties of the submicrocopper particles is more easily obtained. The volume average particle diameter of the submicrocopper particles may be greater than or equal to 0.15 µm and less than or equal to 0.8 µm, may be greater than or equal to 0.15 µm and less than or equal to 0.6 µm, may be greater than or equal to 0.2 µm and less than or equal to 0.5 µm, or may be greater than or equal to 0.3 µm and less than or equal to 0.45 µm, from the viewpoint of further obtaining the effects described above.

Note that, herein, the volume average particle diameter indicates a 50% volume average particle diameter. In the case of obtaining the volume average particle diameter of the copper particles, the volume average particle diameter can be obtained by a method in which the copper particles that are a raw material, or dry copper particles in which volatilize components are removed from the binder are dispersed in the dispersion medium, and are measured by a light scattering method grain size distribution measurement device (for example, a Shimadzu nanoparticle size distribution measurement device (SALD-7500nano, manufactured by SHIMADZU CORPORATION)), or the like. In the case of using a grain size distribution measurement device of a light scattering method, hexane, toluene, α-terpineol, or the like can be used as the dispersion medium.

The submicrocopper particles are capable of containing copper particles having a particle diameter of greater than or equal to 0.12 µm and less than or equal to 0.8 µm by greater than or equal to 10 mass %. The submicrocopper particles are capable of containing the copper particles having a particle diameter of greater than or equal to 0.12 µm and less than or equal to 0.8 µm by greater than or equal to 20 mass %, by greater than or equal to 30 mass %, and by 100 mass %, from the viewpoint of sintering properties of the binder. In a case where a content ratio of the copper particles having a particle diameter of greater than or equal to 0.12 µm and less than or equal to 0.8 µm to the submicrocopper particles is greater than or equal to 20 mass %, it is possible to further improve the dispersibility of the copper particles, and to further suppress an increase in a viscosity and a decrease in a paste concentration.

The content of the submicrocopper particles may be greater than or equal to 20 mass % and less than or equal to 90 mass %, may be greater than or equal to 30 mass % and less than or equal to 90 mass %, may be greater than or equal to 35 mass % and less than or equal to 85 mass %, or may be greater than or equal to 40 mass % and less than or equal to 80 mass %, on the basis of the total mass of the metal particles. In a case where the content of the submicrocopper particles is in the range described above, the binding portion according to this embodiment described above is easily formed.

In addition, in a case where the binder of this embodiment contains submicrocopper particles and flaky microcopper particles, as the copper particles, the content of the submicrocopper particles may be greater than or equal to 20 mass % and less than or equal to 90 mass %, on the basis of a sum of the mass of the submicrocopper particles and the mass of the flaky microcopper particles. In a case where the content of the submicrocopper particles is greater than or equal to 20 mass %, a gap between the flaky microcopper particles can be sufficiently filled, and the binding portion according to this embodiment described above is easily formed. In a case where the content of the submicrocopper particles is less than or equal to 90 mass %, the volume contraction at the time of sintering the binder can be sufficiently suppressed, and thus, the binding portion according to this embodiment described above is easily formed. The content of the submicrocopper particles may be greater than or equal to 30 mass % and less than or equal to 85 mass %, may be greater than or equal to 35 mass % and less than or equal to 85 mass %, or may be greater than or equal to 40 mass % and less than or equal to 80 mass %, on the basis of the sum of the mass of the submicrocopper particles and the mass of the flaky microcopper particles, from the viewpoint of further obtaining the effects described above.

The shape of the submicrocopper particles is not particularly limited. Examples of the shape of the submicrocopper particles include a spherical shape, a massive shape, an acicular shape, a flaky shape, an approximately spherical shape, and an aggregate thereof. The shape of the submicrocopper particles may be the spherical shape, the approximately spherical shape, and the flaky shape, from the viewpoint of the dispersibility and filling properties, and may be the spherical shape or the approximately spherical shape, from the viewpoint of combustion properties, the dispersibility, mixing properties with respect to the flaky microcopper particles.

An aspect ratio of the submicrocopper particles may be less than or equal to 5, or may be less than or equal to 3, from the viewpoint of the dispersibility, the filling properties, and the mixing properties with respect to the flaky microcopper particles. Herein, the "aspect ratio" indicates Long Side/Thickness of the particles. The long side and the thickness of the particles, for example, can be measured from an SEM image of the particles.

The submicrocopper particles may be treated with a specific surface treatment agent. Examples of the specific surface treatment agent include an organic acid having 8 to 16 carbon atoms. Examples of the organic acid having 8 to 16 carbon atoms include a saturated fatty acid such as a caprylic acid, methyl heptanoate, ethyl hexanoate, propyl pentanoate, a pelargonic acid, methyl octanoate, ethyl heptanoate, propyl hexanoate, a capric acid, methyl nonanoate, ethyl octanoate, propyl heptanoate, butyl hexanoate, an undecanoic acid, methyl decanoate, ethyl nonanoate, propyl octanoate, butyl heptanoate, a lauric acid, methyl undecanoate, ethyl decanoate, propyl nonanoate, butyl octanoate, pentyl heptanoate, a tridecanoic acid, methyl dodecanoate, ethyl undecanoate, propyl decanoate, butyl nonanoate, pentyl octanoate, a myristic acid, methyl tridecanoate, ethyl dodecanoate, propyl undecanoate, butyl decanoate, pentyl nonanoate, hexyl octanoate, a pentadecanoic acid, methyl tetradecanoate, ethyl tridecanoate, propyl dodecanoate, butyl undecanoate, pentyl decanoate, hexyl nonanoate, a palmitic acid, methyl pentadecanoate, ethyl tetradecanoate, propyl tridecanoate, butyl dodecanoate, pentyl undecanoate, hexyl decanoate, heptyl nonanoate, methyl cyclohexane carboxylate, ethyl cyclohexane carboxylate, propyl cyclohexane carboxylate, butyl cyclohexane carboxylate, pentyl cyclohexane carboxylate, hexyl cyclohexane carboxylate, heptyl cyclohexane carboxylate, octyl cyclohexane carboxylate, and nonyl cyclohexane carboxylate; an unsaturated fatty acid such as an octenoic acid, a nonenoic acid, methyl nonenoate, a decenoic acid, an undecenoic acid, a dodecenoic acid, a tridecenoic acid, a tetradecenoic acid, a myristoleic acid, a pentadecenoic acid, a hexadecenoic acid, a palmitoleic acid, and a sapienic acid; and an aromatic carboxylic acid such as a terephthalic acid, a pyromellitic acid, an o-phenoxy benzoate, methyl benzoate, ethyl benzoate, propyl benzoate, butyl benzoate, pentyl benzoate, hexyl benzoate, heptyl benzoate, octyl benzoate, and nonyl benzoate. One type of the organic acids may be independently used, or two or more types thereof may be used by being combined. By combining such organic acids and the submicrocopper particles described above together, it is possible to make the dispersibility of the submicrocopper particles and desorption properties of the organic acid at the time of sintering compatible.

A treatment amount of the surface treatment agent may be the amount of a one-molecular layer to a three-molecular layer attached onto the surface of the submicrocopper particles. The amount can be calculated from the number (n) of molecular layers attached onto the surface of the submicrocopper particles, a specific surface area (Ap) of the submicrocopper particles (Unit: $m^2/g$), a molecular weight (Ms) of the surface treatment agent (Unit: g/mol), a minimum coating area (SS) of the surface treatment agent (Unit: $m^2$/piece), and an Avogadro's number (NA) ($6.02 \times 10^{23}$ pieces). Specifically, the treatment amount of the surface treatment agent is calculated in accordance with an expression of Treatment Amount (Mass %) of Surface Treatment Agent=$\{(n \cdot Ap \cdot Ms)/(SS \cdot NA + n \cdot Ap \cdot Ms)\} \times 100\%$.

The specific surface area of the submicrocopper particles is calculated by measuring the dry submicrocopper particles with a BET specific surface area measurement method. In a case where the surface treatment agent is a linear saturated fatty acid, the minimum coating area of the surface treatment agent is $2.05 \times 10^{-19}$ $m^2$/1 molecule. In other surface treatment agents, for example, the minimum coating area can be measured by a calculation from a molecular model or a method described in "Chemistry and Education" (Katsuhiro UEDA, Sumio INAFUKU, and Iwao MORI, 40(2), 1992, p114-117). An example of a quantitative method of the surface treatment agent will be described. The surface treatment agent can be identified by a thermal desorption gas·gas chromatograph mass spectrometer of a dry powder in which the dispersion medium is removed from the binder, and thus, the number of carbon atoms and a molecular weight of the surface treatment agent can be determined. A carbon fraction ratio of the surface treatment agent can be analyzed by carbon fraction analysis. Examples of a carbon fraction analysis method include a high-frequency induction heating furnace combustion/infrared absorption method. The amount of surface treatment agent can be calculated from the number of carbon atoms, the molecular weight, and the carbon fraction ratio of the identified surface treatment agent, in accordance with the expression described above.

The treatment amount of the surface treatment agent may be greater than or equal to 0.07 mass % and less than or equal to 2.1 mass %, may be greater than or equal to 0.10 mass % and less than or equal to 1.6 mass %, or may be greater than or equal to 0.2 mass % and less than or equal to 1.1 mass %.

Commercially available submicrocopper particles can be used as the submicrocopper particles. Examples of the commercially available submicrocopper particles include CH-0200 (manufactured by MITSUI MINING & SMELTING CO., LTD., a volume average particle diameter of 0.36 μm), HT-14 (manufactured by MITSUI MINING & SMELTING CO., LTD., a volume average particle diameter of 0.41 μm), CT-500 (manufactured by MITSUI MINING & SMELTING CO., LTD., a volume average particle diameter of 0.72 μm), and Tn-Cu100 (manufactured by TAIYO NIPPON SANSO CORPORATION, a volume average particle diameter of 0.12 μm).

(Microcopper Particles)

Examples of the microcopper particles include microcopper particles containing copper particles having a particle diameter of greater than or equal to 1.0 μm and less than or equal to 50 μm, and for example, copper particles having a volume average particle diameter of greater than or equal to 1.0 μm and less than or equal to 50 μm can be used as the microcopper particles. The volume average particle diameter of the microcopper particles may be greater than or equal to 2.0 μm and less than or equal to 20 μm, may be greater than or equal to 2.0 μm and less than or equal to 10 μm, may be greater than or equal to 3.0 μm and less than or equal to 20 μm, or may be greater than or equal to 3.0 μm and less than or equal to 10 μm.

Examples of the shape of the microcopper particles include a spherical shape, a massive shape, an acicular shape, a flaky shape, an approximately spherical shape, and an aggregate thereof. Among them, the flaky shape is preferable. Note that, the flaky shape includes a flat shape such as a platy shape and a scaly shape.

Examples of the flaky microcopper particles include flaky microcopper particles containing copper particles having a maximum diameter of greater than or equal to 1 μm and less than or equal to 20 μm and an aspect ratio of greater than or equal to 4, and for example, copper particles having an average maximum diameter of greater than or equal to 1 μm and less than or equal to 20 μm and an aspect ratio of greater than or equal to 4 can be used as the flaky microcopper particles. In a case where the average maximum diameter and the aspect ratio of the flaky microcopper particles are in the range described above, the volume contraction at the time of sintering the binder can be sufficiently reduced, and the binding portion according to this embodiment described above is easily formed. The average maximum diameter of the flaky microcopper particles may be greater than or equal to 1 μm and less than or equal to 10 μm, or may be greater than or equal to 3 μm and less than or equal to 10 μm, from the viewpoint of further obtaining the effects described above. The maximum diameter and the average maximum diameter of the flaky microcopper particles, for example, can be measured from an SEM image of the particles, and are obtained as a long diameter X of a flaky structure described below and an average value Xav of the long diameters.

The flaky microcopper particles are capable of containing copper particles having a maximum diameter of greater than or equal to 1 μm and less than or equal to 20 μm by greater than or equal to 50 mass %. The flaky microcopper particles are capable of containing the copper particles having a maximum diameter of greater than or equal to 1 μm and less than or equal to 20 μm by greater than or equal to 70 mass %, by greater than or equal to 80 mass %, and by 100 mass %, from the viewpoint of an orientation in a binding body, the reinforcement effect, filling properties of the binding paste. It is preferable that the flaky microcopper particles, for example, do not contain particles having a size of greater than a binding thickness, such as particles having a maximum diameter of greater than 20 μm, from the viewpoint of suppressing a binding defect.

A method of calculating the long diameter X of the flaky microcopper particles from an SEM image is exemplified. A powder of the flaky microcopper particles is placed on a carbon tape for SEM with a spatula, and is set to a sample for SEM. The sample for SEM is observed by an SEM device at a magnification of 5000 times. A rectangle circumscribed the flaky microcopper particles in the SEM image is plotted by image processing software, and a long side of the rectangle is set to the long diameter X of the particles. Such measurement is performed with respect to 50 or more flaky microcopper particles by using a plurality of SEM images, and thus, the average value Xav of the long diameters is calculated.

The aspect ratio of the flaky microcopper particles may be greater than or equal to 4, or may be greater than or equal to 6. In a case where the aspect ratio is in the range described above, the flaky microcopper particles in the binder are oriented to be approximately parallel to the binding surface, and thus, the volume contraction at the time of sintering the binding layer (the binder) can be suppressed, and the binding portion according to this embodiment described above is easily formed.

The shape of the flaky microcopper particles according to this embodiment can be defined by parameters such as the long diameter (the average maximum diameter) X, a medium diameter (a width) Y, and a short diameter (a thickness) T. In a three-dimensional shape of the flaky microcopper particles, the long diameter X is a distance between two parallel planes circumscribed the flaky microcopper particles, two parallel planes being selected such that the distance between two parallel planes is maximized. The medium diameter Y is a distance between two parallel planes that are orthogonal to two parallel planes for defining the long diameter X and are circumscribed the flaky microcopper particles, two parallel planes being selected such that the distance between two parallel planes is maximized. The short diameter T is a distance between two parallel planes that are orthogonal to two parallel planes for defining the long diameter X and two parallel planes for defining the medium diameter Y and are circumscribed the flaky microcopper particles, two parallel planes being selected such that the distance between two parallel planes is maximized.

The average value Xav of the long diameters may be greater than or equal to 1 μm and less than or equal to 50.0 μm, may be greater than or equal to 1 μm and less than or equal to 20 μm, or may be greater than or equal to 3 μm and less than or equal to 10 μm. In a case where Xav is in the range described above, in the binding body that is manufactured by sintering the binder, the sintered body of the binder is easily formed to have a suitable thickness.

A ratio Xav/Tav (the aspect ratio) of the average value Xav of the long diameters to an average value Tav of the short diameters may be greater than or equal to 4.0, may be greater than or equal to 6.0, or may be greater than or equal to 10.0. In a case where Xav/Tav is in the range described above, the flaky microcopper particles in the binder are easily oriented to be approximately parallel to the binding surface, and thus, the volume contraction at the time of sintering the binder can be suppressed, and a binding strength of the binding body that is manufactured by sintering the binder is easily ensured. In a case where the binder is used for binding the thermoelectric semiconductor and the electrode in the thermoelectric conversion module, a binding strength and connection reliability of the thermoelectric conversion module are easily improved.

A ratio Xav/Yav of the average value Xav of the long diameters to an average value Yav of the medium diameters may be less than or equal to 2.0, may be less than or equal to 1.7, or may be less than or equal to 1.5. In a case where Xav/Yav is in the range described above, the flaky microcopper particles are flaky particles having a certain area, the flaky microcopper particles in the binder are easily oriented to be approximately parallel to the binding surface, and thus, the volume contraction at the time of sintering the binder can be suppressed, and the binding strength of the binding body that is manufactured by sintering the binder is easily ensured. In a case where the binder is used for binding the thermoelectric semiconductor and the electrode in the thermoelectric conversion module, the binding strength and the connection reliability of the thermoelectric conversion module are easily improved. A case where Xav/Yav is greater than 2.0 indicates that the shape of the flaky microcopper particles is close to an elongated linear shape.

A Yav/Tav of the average value Yav of the medium diameters to the average value Tav of the short diameters may be greater than or equal to 2.5, may be greater than or equal to 4.0, or may be greater than or equal to 8.0. In a case where Yav/Tav is in the range described above, the flaky microcopper particles in the binder are easily oriented to be approximately parallel to the binding surface, and thus, the volume contraction at the time of sintering the binder can be suppressed, and the binding strength of the binding body that is manufactured by sintering the binder is easily ensured. In a case where the binder is used for binding the thermoelectric semiconductor and the electrode in the thermoelectric conversion module, the binding strength and the connection reliability of the thermoelectric conversion module are easily improved.

The content of the flaky microcopper particles may be greater than or equal to 1 mass % and less than or equal to 90 mass %, may be greater than or equal to 10 mass % and less than or equal to 70 mass %, or may be greater than or equal to 20 mass % and less than or equal to 50 mass %, on the basis of the total mass of the metal particles. In a case where the content of the flaky microcopper particles is in the range described above, the binding portion according to this embodiment described above is easily formed.

In a case where the binder of this embodiment contains the submicrocopper particles and the flaky microcopper particles, as the copper particles, a sum of the content of the submicrocopper particles and the content of the flaky microcopper particles may be greater than or equal to 80 mass %, on the basis of the total mass of the metal particles. In a case where the sum of the content of the submicrocopper particles and the content of the flaky microcopper particles is in the range described above, the binding portion according to this embodiment described above is easily formed. The sum of the content of the submicrocopper particles and the content of the flaky microcopper particles may be greater than or equal to 90 mass %, may be greater than or equal to 95 mass %, or may be 100 mass %, on the basis of the total mass of the metal particles, from the viewpoint of further obtaining the effects described above.

In the flaky microcopper particles, whether or not to perform the treatment of the surface treatment agent is not particularly limited. The flaky microcopper particles may be treated with the surface treatment agent, from the viewpoint of dispersion stability and oxidation resistance. The surface treatment agent may be removed at the time of binding. Examples of such a surface treatment agent include an aliphatic carboxylic acid such as a palmitic acid, a stearic acid, an arachidic acid, and an oleic acid; an aromatic carboxylic acid such as a terephthalic acid, a pyromellitic acid, and o-phenoxy benzoate; aliphatic alcohol such as cetyl alcohol, stearyl alcohol, isobornyl cyclohexanol, and tetraethylene glycol; aromatic alcohol such as p-phenyl phenol; alkyl amine such as octyl amine, dodecyl amine, and stearyl amine; aliphatic nitrile such as stearonitrile and decane nitrile; a silane coupling agent such as alkyl alkoxy silane; a high-molecular treatment agent such as polyethylene glycol, polyvinyl alcohol, polyvinyl pyrrolidone, and a silicone oligomer, and the like. One type of the surface treatment agents may be independently used, or two or more types thereof may be used by being combined.

The treatment amount of the surface treatment agent may be the amount of a one-molecular layer on a particle surface. Such a treatment amount of the surface treatment agent is changed in accordance with a specific surface area of the flaky microcopper particles, the molecular weight of the surface treatment agent, and the minimum coating area of the surface treatment agent. In general, the treatment amount of the surface treatment agent is greater than or equal to 0.001 mass %. The specific surface area of the flaky microcopper particles, the molecular weight of the surface treatment agent, and the minimum coating area of the surface treatment agent can be calculated by the method described above.

In a case where the binder is prepared from only the submicrocopper particles described above, volume contraction due to the drying of the dispersion medium and sintering contraction are large, and thus, the binder is easily peeled off from the surface to be bound at the time of sintering the binder, and in the binding of the thermoelectric semiconductor or the like, it is difficult to obtain sufficient binding properties and sufficient reliability. The submicrocopper particles and the flaky microcopper particles are used together, and thus, the volume contraction at the time of sintering the binder is suppressed, and the binding portion according to this embodiment described above is easily formed.

In the binder of this embodiment, the content of microcopper particles having a maximum diameter of greater than or equal to 1 μm and less than or equal to 20 μm and an aspect ratio of less than 2, in the metal particles, is preferably less than or equal to 50 mass %, and is more preferably less than or equal to 30 mass %, on the basis of the total amount of flaky microcopper particles having a maximum diameter of greater than or equal to 1 μm and less than or equal to 20 μm and an aspect ratio of greater than or equal to 4. By restricting the content of the microcopper particles having an average maximum diameter of greater than or equal to 1 μm and less than or equal to 20 μm and an aspect ratio of less than 2, the flaky microcopper particles in the binder are easily oriented to be approximately parallel to the binding surface, and thus, the volume contraction at the time of sintering the binder can be more effectively suppressed. Accordingly, a sintered metal layer according to this embodiment described above is easily formed. From the viewpoint of more easily obtaining such effects, the content of the microcopper particles having an average maximum diameter of greater than or equal to 1 μm and less than or equal to 20 μm and an aspect ratio of less than 2 may be less than or equal to 20 mass %, or may be less than or equal to 10 mass %, on the basis of the total amount of the flaky microcopper particles having a maximum diameter of greater than or equal to 1 μm and less than or equal to 20 μm and an aspect ratio of greater than or equal to 4.

Commercially available flaky microcopper particles can be used as the flaky microcopper particles according to this embodiment. Examples of the commercially available Commercially available include MA-C025 (manufactured by MITSUI MINING & SMELTING CO., LTD., an average maximum diameter of 4.1 μm), 3L3 (manufactured by Fukuda Metal Foil & Powder Co., Ltd., a volume maximum diameter of 7.3 μm), 1110F (manufactured by MITSUI MINING & SMELTING CO., LTD., an average maximum diameter of 5.8 μm), and 2L3 (manufactured by Fukuda Metal Foil & Powder Co., Ltd., an average maximum diameter of 9 μm).

In the binder of this embodiment, microcopper particles can be used in which the flaky microcopper particles having a maximum diameter of greater than or equal to 1 μm and less than or equal to 20 μm and an aspect ratio of greater than or equal to 4 are contained as the microcopper particles to be blended, and the content of the microcopper particles having a maximum diameter of greater than or equal to 1 μm and less than or equal to 20 μm and an aspect ratio of less than 2 is less than or equal to 50 mass %, and is preferably less than or equal to 30 mass %, on the basis of the total amount of the flaky microcopper particles described above. In the case of using the commercially available flaky microcopper particles, the microcopper particles may be selected in which the flaky microcopper particles having a maximum diameter of greater than or equal to 1 μm and less than or equal to 20 μm and an aspect ratio of greater than or equal to 4 are contained as the microcopper particles to be blended, and the content of the microcopper particles having a maximum diameter of greater than or equal to 1 μm and less than or equal to 20 μm and an aspect ratio of less than 2 is less than or equal to 50 mass %, and is preferably less than or equal to 30 mass %, on the basis of the total amount of the flaky microcopper particles described above.

(Other Metal Particles in Addition to Copper Particles)

Other metal particles in addition to the submicrocopper particles and the microcopper particles described above may be contained as the metal particles, and for example, particles of zinc, nickel, silver, gold, palladium, platinum, or the like may be contained.

A volume average particle diameter of the other metal particles may be greater than or equal to 0.01 μm and less than or equal to 10 μm, may be greater than or equal to 0.01 μm and less than or equal to 5 μm, or may be greater than or equal to 0.05 μm and less than or equal to 3 μm. In the case of containing the other metal particles, the content of the other metal particles may be less than 20 mass %, or may be less than or equal to 10 mass %, on the basis of the total mass of the metal particles, from the viewpoint of obtaining sufficient binding properties. The other metal particles may not be contained. The shape of the other metal particles is not particularly limited.

The binder of this embodiment contains the other metal particles in addition to the copper particles, and thus, the sintered metal layer in which a plurality of types of metals are soluted or dispersed can be obtained, and therefore, mechanical properties such as a yield stress and a fatigue strength of the binding portion are improved, and the connection reliability is easily improved. In addition, a plurality of types of metal particles are added, and thus, the binding strength and the connection reliability of the binding portion to be formed are easily improved with respect to a bound body such as the thermoelectric semiconductor and the electrode.

(Dispersion Medium)

The dispersion medium is not particularly limited, but may be a dispersion medium having volatility. Examples of a volatile dispersion medium include monohydric and polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amide such as N-methyl-2-pyrrolidone, N,N-dimethyl acetamide, and N,N-dimethyl formamide; aliphatic hydrocarbon such as cyclohexane, octane, nonane, decane, and undecane; aromatic hydrocarbon such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

In a case where the total mass of the metal particles is 100 parts by mass, the content of the dispersion medium may be 5 parts by mass to 50 parts by mass. In a case where the content of the dispersion medium is in the range described above, the binder can be adjusted to have a more suitable viscosity, and the sintering of the copper particles is less likely to be hindered.

In this embodiment, it is preferable that the dispersion medium contains a solvent having a boiling point of higher than or equal to 300° C. The boiling point of the solvent having a boiling point of higher than or equal to 300° C. may be higher than or equal to 300° C. and lower than or equal to 450° C., may be higher than or equal to 305° C. and lower than or equal to 400° C., or may be higher than or equal to 310° C. and less than or equal to 380° C., from the viewpoint of rapidly evaporating and removing the solvent at the time of reaching a binding temperature without hindering sintering and densification at the time of sintering the binding layer.

In the solvent having a boiling point of higher than or equal to 300° C., it is preferable to select a structure having high affinity with the surface of the metal particles, in order to improve the dispersibility of the metal particles to be contained. In a case where the metal particles are subjected to a surface treatment with a surface treatment agent having an alkyl group, it is preferable to select a solvent having an alkyl group. Examples of such a solvent having a boiling point of higher than or equal to 300° C. include isobornyl cyclohexanol (MTPH, manufactured by Nippon Terpene Chemicals, Inc.), butyl stearate, EXCEPARL BS (manufactured by Kao Corporation), stearyl stearate, EXCEPARL SS (manufactured by Kao Corporation), 2-ethyl hexyl stearate, EXCEPARL EH-S (manufactured by Kao Corporation), isotridecyl stearate, EXCEPARL TD-S (manufactured by Kao Corporation), isooctadecanol, Fineoxocol 180 (manufactured by Nissan Chemical Corporation), Fineoxocol 180T (manufactured by Nissan Chemical Corporation), 2-hexyl decanol, Fineoxocol 1600 (manufactured by Nissan Chemical Corporation), tributyrin, tetraethylene glycol, heptadecane, octadecane, nonadecane, eicosane, heneicosane, docosane, methyl heptadecane, tridecyl cyclohexane, tetradecyl cyclohexane, pentadecyl cyclohexane, hexadecyl cyclohexane, undecyl benzene, dodecyl benzene, tetradecyl benzene, tridecyl benzene, pentadecyl benzene, hexadecyl benzene, heptadecyl benzene, nonyl naphthalene, diphenyl propane, octyl octanoate, methyl myristate, ethyl myristate, methyl linoleate, methyl stearate, triethylene glycol bis(2-ethyl hexanoate), tributyl citrate, pentyl phenol, dibutyl sebacate, oleyl alcohol, cetyl alcohol, methoxy phenethyl alcohol, benzyl phenol, hexadecane nitrile, heptadecane nitrile, benzyl benzoate, cinmethylin, and the like.

It is preferable to select a solvent having a Hansen solubility parameter close to that of the surface treatment agent, as the solvent having a boiling point of higher than or equal to 300° C., from the viewpoint of improving the dispersibility. It is preferable that the solvent having a boiling point of higher than or equal to 300° C. has at least one type of group selected from the group consisting of a hydroxy group, an ether group, and an ester group, as the surface treatment agent, from the viewpoint of easily handling an organic acid, organic amine, a hydroxyl group-containing polymer, polyvinyl pyrrolidone, and the like. The Hansen solubility parameter, for example, can be searched from a database at the back of the following published literature, or can be searched/calculated with a database and simulation integrated software HSPiP.

Published Literature: "HANSEN SOLUBILITY PARAMETERS: A USER'S HANDBOOK" (CRC Press, 1999)

The content of the solvent having a boiling point of higher than or equal to 300° C. can be greater than or equal to 2 mass %, on the basis of the total mass of the binder. The content of the solvent having a boiling point of higher than or equal to 300° C. may be greater than or equal to 2.2 mass %, or may be greater than or equal to 2.4 mass %, on the basis of the total mass of the binder. In a case where the content of the solvent having a boiling point of higher than or equal to 300° C. is in the range described above, a constant amount of solvent is capable of remaining in the binding layer at the time of sintering the binding layer of this embodiment, flexibility and attachment properties of the binder between members are easily maintained, and even in a case where the members used in binding have different thermal expansion rates, binding can be performed without peeling. An upper limit of the content of the solvent having a boiling point of higher than or equal to 300° C. is not particularly limited. The upper limit of the content of the solvent may be less than or equal to 9 mass %, on the basis of the total mass of the binder, from the viewpoint of suppressing a time until the dispersion medium is removed at a sintering temperature such that a sintering time can be shortened.

In addition, in the binder of this embodiment, the solvent having a boiling point of higher than or equal to 300° C. may be greater than or equal to 15 volume %, may be greater than or equal to 17 volume %, or may be greater than or equal to 23 volume %, on the basis of a total volume of the binder. In a case where the content of the solvent having a boiling point of higher than or equal to 300° C. is in the range described above, a constant amount of solvent is capable of remaining in the binding layer at the time of sintering the binding layer of this embodiment, the flexibility and the attachment properties of the binder between the members are easily maintained, and even in a case where the members used in binding have different thermal expansion rates, binding can be performed without peeling. An upper limit of the content of the solvent having a boiling point of higher than or equal to 300° C. is not particularly limited. The upper limit of the content of the solvent may be less than or equal to 60 volume %, on the basis of the total volume of the binder, from the viewpoint of suppressing the time until the dispersion medium is removed at the sintering temperature such that the sintering time can be shortened.

The type of dispersion medium contained in the binder, for example, can be analyzed by a gas chromatograph-mass analysis method of high temperature desorption gas, and TOF-SIMS. As other analysis methods, a supernatant that is obtained by separating particle components with centrifugal separation may be identified by general organic analysis, for example, FT-IR, NMR, a liquid chromatograph, and a combination thereof. The ratio of the type of dispersion medium can be determined by the liquid chromatograph, the NMR, or the like.

(Additive)

A monovalent carboxylic acid having 1 to 9 carbon atoms; a wettability improver such as a nonionic surfactant and a fluorine-based surfactant; an antifoaming agent such as silicone oil; an ion trapping agent such as an inorganic ion exchanger, or the like may be suitably added to the binder, as necessary.

It is preferable that the binder contains the monovalent carboxylic acid having 1 to 9 carbon atoms, from the viewpoint of enabling binding to be performed at a low temperature of lower than or equal to 250° C. and of obtaining a sufficient binding strength. The monovalent carboxylic acid having 1 to 9 carbon atoms, for example, is a carboxylic acid having a hydrocarbon group having 1 to 8 carbon atoms and one carboxyl group. The hydrocarbon group may be any of a saturated hydrocarbon group and an unsaturated hydrocarbon group, or may be any of a linear hydrocarbon group, a branched hydrocarbon group, and a cyclic hydrocarbon group. Note that, it is preferable that the monovalent carboxylic acid having 1 to 9 carbon atoms does not have a hydroxy group.

A formic acid ($CH_2O_2$), an acetic acid ($C_2H_4O_2$), a propionic acid or a propanoic acid ($C_3H_6O_2$), a butanoic acid or a butyric acid ($C_4H_8O_2$), a pentanoic acid or a valeric acid ($C_5H_{10}O_2$), caproic acid or a hexanoic acid ($C_6H_{12}O_2$), 2-methyl pentanoate or 2-methyl valerate ($C_6H_{12}O_2$), a heptanoic acid or an enanthic acid ($C_7H_{14}O_2$), a caprylic acid or an octanoic acid ($C_8H_{16}O_2$), a pelargonic acid or a nonanoic acid ($C_9H_{18}O_2$), a crotonic acid ($C_4H_6O_2$), a methacrylic acid ($C_4H_6O_2$), an angelic acid ($C_5H_8O_2$), a tiglic acid ($C_5H_8O_2$), a pivalic acid ($C_5H_{10}O_2$), 3-methyl-2-hexenoate ($C_7H_{12}O_2$), 4-methyl-3-hexenoate ($C_7H_{12}O_2$), 3-methyl butanoate ($C_5H_{10}O_2$), cyclohexane carboxylate ($C_7H_{12}O_2$), and the like are exemplified as the monovalent carboxylic acid having 1 to 9 carbon atoms.

It is preferable that the content of the monovalent carboxylic acid having 1 to 9 carbon atoms is greater than or equal to 0.2 mass %, on the basis of a total amount of the dispersion medium, from the viewpoint of low temperature binding and the binding strength. In addition, the content of the monovalent carboxylic acid having 1 to 9 carbon atoms is preferably less than 1.0 mass %, and is more preferably less than or equal to 0.9 mass %, on the basis of the total amount of the dispersion medium, from the viewpoint of preservation stability of the binder. By using the binder containing the monovalent carboxylic acid having 1 to 9 carbon atoms at the ratio described above, it is possible to obtain a die shear strength of greater than or equal to 15 MPa even in a condition where a highest achieving temperature is lower than or equal to 225° C.

The binder according to this embodiment described above is preferable as a binder for a thermoelectric conversion module that is used for binding the thermoelectric semiconductor and the electrode in the thermoelectric conversion module.

(Preparation of Binder)

The binder may be prepared by mixing the submicrocopper particles, the microcopper particles, the other metal particles, and arbitrary additives with the dispersion medium. A stirring treatment may be performed after each component is mixed. In the binder, a maximum particle diameter of a dispersion liquid may be adjusted by a classification manipulation.

The submicrocopper particles, the surface treatment agent, and the dispersion medium may be mixed in advance, a dispersion liquid of the submicrocopper particles may be prepared by performing a dispersion treatment, and the microcopper particles, the other metal particles, and the arbitrary additives may be further mixed, and thus, the binder may be prepared. According to such a procedure, the dispersibility of the submicrocopper particles is improved, mixing properties with respect to the microcopper particles are excellent, and the performance of the binder is further improved. An aggregation substance may be removed by performing the classification manipulation with respect to the dispersion liquid of the submicrocopper particles.

(Binding Portion)

In the first embodiment, the second embodiment, and the third embodiment described above, the binding portion includes the sintered body of the binder according to this embodiment, containing the copper particles.

Figure 4:
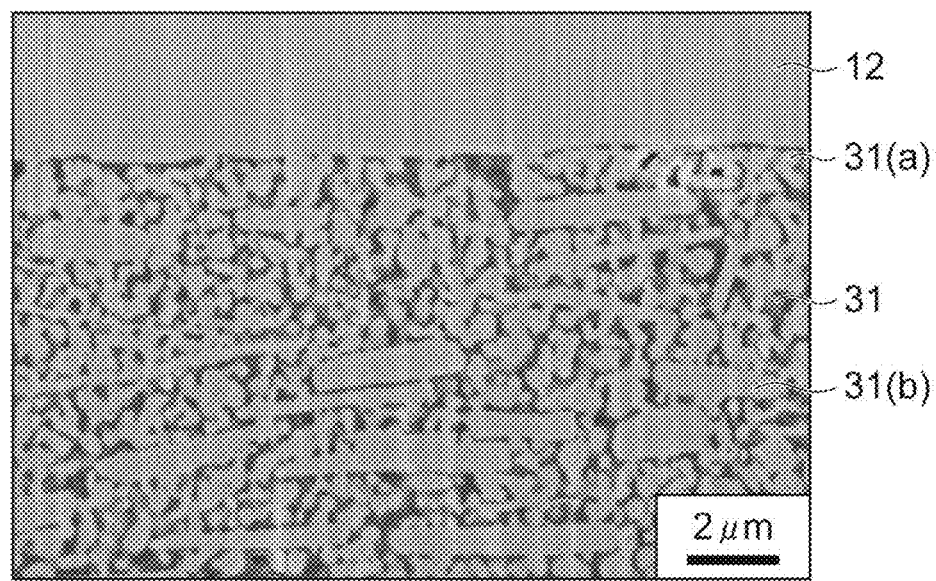
FIG. 4 is a sectional enlarged view of a binding portion.

FIG. 4 is a sectional enlarged view of the binding portion according to this embodiment. The binding portion 31 binding the electrode 12 and the thermoelectric semiconductor together is the sintered body of the binding layer formed of the binder in which the metal particles and the dispersion medium are contained, and the metal particles contains the submicrocopper particles and the microcopper particles, and is a porous body having a structure 31(a) derived from the submicrocopper particles, a structure 31(b) derived from the copper particles of the flaky microcopper particles as the microcopper particles, and pores.

In this embodiment, it is possible to form a sintered body having a volume resistivity, a heat conductivity, and a binding strength of less than or equal to $1\times10^{-5}$ Ω·cm, greater than or equal to 50 W·m$^{-1}$·K$^{-1}$, and greater than or equal to 20 MPa, respectively, by heating the binding layer formed of the binder of this embodiment at lower than or equal to 350° C. in hydrogen having a concentration of greater than or equal to 1%, and it is possible to attain a thermoelectric conversion module excellent in power generation performance and heat stress properties by including such a sintered body in the binding portion.

The volume resistivity is calculated by the following expression.

$$\rho = A \cdot R / L$$

Here, ρ represents an electric resistivity per unit volume (the volume resistivity) (Ω·m), R represents a resistance (Ω) of the sintered body, A represents a sectional area (m$^2$) of the sintered body, and L represents a thickness (m) of the sintered body.

The heat conductivity can be calculated from a thermal diffusion ratio, a specific heat capacity, and a density of the binding portion. For example, the thermal diffusion ratio of the binding portion is measured by a laser flash method (LFA467, manufactured by NETZSCH Japan K. K.), and the heat conductivity [W/(m·K)] of the binding portion at 25° C. can be calculated by a product of the thermal diffusion ratio, the specific heat capacity obtained by a differential scanning calory measurement device (DSC8500, manufactured by PerkinElmer, Inc.), and the density obtained as described above.

The binding strength can be measured by using a universal bond tester (4000 Series, manufactured by Nordson Dage) or the like. In addition, the binding strength can be measured by methods described in examples.

The binding portion described above has the structure 31(*b*) derived from the flaky copper particles that are oriented to be approximately parallel to an interface with respect to the electrode, and the content of copper in the binding portion may be greater than or equal to 65 volume %, on the basis of the volume of the binding portion.

In a structure derived from the copper particles of the flaky microcopper particles according to this embodiment, that is, a flaky structure of sintered copper having a flaky structure, a ratio of a long diameter to a thickness may be greater than or equal to 5. A number average diameter of the long diameters of the flaky structure may be greater than or equal to 2 µm, may be greater than or equal to 3 µm, or may be greater than or equal to 4 µm. In a case where the shape of the flaky structure is in the range described above, a reinforcement effect due to the flaky structure of the binding portion is improved, and the thermoelectric conversion module is more excellent in reliability.

The long diameter and the thickness of the flaky structure, for example, can be obtained from an SEM image of the binding body (the binding portion and the electrode or the thermoelectric semiconductor). Hereinafter, a method of measuring the long diameter and the thickness of the flaky structure from the SEM image will be exemplified. The binding body is poured with an epoxy casting resin such that the entire sample is buried, and is cured. The cast sample is cut in the vicinity of a sectional surface to be observed, the sectional surface is cut by polishing, and cross-section polisher (CP) processing is performed. The sectional surface of the sample is observed by an SEM device at a magnification of 5000 times. A sectional surface image (for example, a magnification of 5000 times) of the binding body is acquired, and when in a linear portion, a rectangular portion, and an ellipsoidal portion, which are a dense continuous portion, a straight line having a maximum length in straight lines included in the portions is set to a long diameter, and a straight line having a maximum length in straight lines orthogonal to the straight line having a maximum length, included in the portions, is set to a thickness, a structure in which the length of a long diameter is greater than or equal to 1 µm, and a ratio of Long Diameter/Thickness is greater than or equal to 4 is regarded as the flaky structure, and the long diameter and the thickness of the flaky structure can be measured by image processing software having a length measurement function. An average value thereof is obtained by calculating a number average at 20 or more points that are randomly selected.

The long diameter of the flaky structure is defined as a distance between two parallel straight lines circumscribed the flaky structure, two parallel straight lines being selected such that the distance between two parallel straight lines is maximized. The thickness of the flaky structure is defined as a distance between two parallel planes that are orthogonal to two parallel straight lines for defining the long diameter and are circumscribed the flaky structure, two parallel planes being selected such that the distance between two parallel planes is maximized.

The image processing software is not particularly limited, and for example, Microsoft PowerPoint (manufactured by Microsoft Corporation) and ImageJ (manufactured by National Institutes of Health) can be used as the image processing software.

A content ratio of the flaky structure to the entire structural body can be calculated by obtaining the sectional area of the binding body from the SEM image of the binding body, by obtaining the sectional area of the flaky structure from the long diameter and the thickness of the flaky structure that are measured by the method described above, and by dividing a total sectional area of the flaky structure that is a sum of the sectional areas described above by the sectional area of the binding body. In the binding portion according to this embodiment, the content ratio of the flaky structure to the entire structural body that is obtained by the method described above may be 10% to 40%, or may be 20% to 30%.

The content (a volume ratio) of copper in the binding portion can be greater than or equal to 65 volume %, on the basis of the volume of the binding portion. In a case where the content of copper in the binding portion is in the range described above, it is possible to suppress the formation of a large pore in the binding portion or the sparseness of sintered copper connecting the flaky structures. For this reason, in a case where the content of copper in the binding portion is in the range described above, sufficient heat conduction properties are obtained and a binding strength between the electrode or the thermoelectric semiconductor and the binding portion is improved, and the binding body is excellent in the connection reliability. The content of copper in the binding portion may be greater than or equal to 67 volume %, or may be greater than or equal to 70 volume %, on the basis of the volume of the binding portion. The content of copper in the binding portion may be less than or equal to 90 volume %, on the basis of the volume of the binding portion, from the viewpoint of the easiness of a manufacturing process.

In a case where the composition of the material configuring the binding portion is known, for example, the content of copper in the binding portion can be obtained by the following procedure. First, the binding portion is cut into the shape of a rectangular parallelepiped, the length and the width of the binding portion are measured by a caliper or an outer shape measurement device, and the thickness is measured by a film thickness meter, and thus, the volume of the binding portion is calculated. An apparent density $M_1$ (g/cm$^3$) is obtained from the volume of the binding portion that is cut, and the weight of the binding portion that is measured by a precision balance. The content (volume %) of copper in the binding portion is obtained from Expression (2) described below, by using $M_1$ that is obtained, and a copper density of 8.96 g/cm$^3$.

Content (volume %) of Copper in Binding Portion=
$[(M_1)/8.96] \times 100$     (2)

EXAMPLES

Hereinafter, the present invention will be described in more detail by examples. However, the present invention is not limited to the following examples.

In this example, an acetic acid (manufactured by Wako Pure Chemical Industries, Ltd.), terpineol (manufactured by Wako Pure Chemical Industries, Ltd.), tributyrin (manufactured by Wako Pure Chemical Industries, Ltd.), a hexanoic acid (manufactured by Wako Pure Chemical Industries, Ltd.), a nonanoic acid (manufactured by Wako Pure Chemical Industries, Ltd.), a stearic acid (manufactured by Wako Pure Chemical Industries, Ltd.), a tartaric acid (manufactured by Wako Pure Chemical Industries, Ltd.), a succinic acid (manufactured by Wako Pure Chemical Industries, Ltd.), 2,2-bis(hydroxy methyl) propionate (manufactured by Tokyo Chemical Industry Co., Ltd.), dodecyl amine (manufactured by Wako Pure Chemical Industries, Ltd.), N,N-dimethyl formamide (manufactured by Wako Pure Chemical Industries, Ltd.), ethyl acetate (manufactured by Wako Pure Chemical Industries, Ltd.), acetonitrile (manufactured by Wako Pure Chemical Industries, Ltd.), and water (ultrapure water, manufactured by Wako Pure Chemical Industries, Ltd.) were used as an additive.

Preparation of Copper Paste for Binding Binder)

Preparation Example 1

0.77 g of α-terpineol (manufactured by Wako Pure Chemical Industries, Ltd.) and 0.33 g of tributyrin (manufactured by Wako Pure Chemical Industries, Ltd.) as a dispersion medium, 0.0022 g of an acetic acid (manufactured by Wako Pure Chemical Industries, Ltd.) as an additive, 6.23 g of CH-0200 (manufactured by MITSUI MINING & SMELTING CO., LTD.) as submicrocopper particles, and 2.67 g of 3L3N (manufactured by Fukuda Metal Foil & Powder Co., Ltd.) as microcopper particles were kneaded with an agate mortar until a dry powder was obtained, and a mixed liquid was moved to a plastic bottle. The plastic bottle with an airtight stopper was stirred at 2000 $min^{-1}$ (2000 rotations/minute) for 2 minutes by using a planetary centrifugal stirrer (Planetary Vacuum Mixer ARV-310, manufactured by THINKY CORPORATION). After that, 0.018 g of zinc (Product Number: 13789, manufactured by Alfa Aesar Inc.) and the mixed liquid were kneaded with an agate mortar until a dry powder was obtained, and the mixed liquid was moved to a plastic bottle. The plastic bottle with an airtight stopper was stirred at 2000 $min^{-1}$ (2000 rotations/minute) for 2 minutes by using a planetary centrifugal stirrer (Planetary Vacuum Mixer ARV-310, manufactured by THINKY CORPORATION). The mixed liquid was set to a copper paste 1 for binding.

Preparation Example 2

A copper paste for binding was obtained as with Preparation Example 1, except that the added amount of the copper particles and the zinc particles, the added amount of the dispersion medium, and the added amount of the additive were changed as shown in the table.

That is, 0.38 g of α-terpineol (manufactured by Wako Pure Chemical Industries, Ltd.) and 0.17 g of tributyrin (manufactured by Wako Pure Chemical Industries, Ltd.) as a dispersion medium, 0.0028 g of an acetic acid (manufactured by Wako Pure Chemical Industries, Ltd.) as an additive, 3.11 g of CH-0200 (manufactured by MITSUI MINING & SMELTING CO., LTD.) as submicrocopper particles, and 1.35 g of 3L3N (manufactured by Fukuda Metal Foil & Powder Co., Ltd.) as microcopper particles were kneaded with an agate mortar until a dry powder was obtained, and a mixed liquid was moved to a plastic bottle. The plastic bottle with an airtight stopper was stirred at 2000 mint (2000 rotations/minute) for 2 minutes by using a planetary centrifugal stirrer (Planetary Vacuum Mixer ARV-310, manufactured by THINKY CORPORATION). After that, 0.0088 g of zinc (Product Number: 13789, manufactured by Alfa Aesar Inc.) and the mixed liquid were kneaded with an agate mortar until a dry powder was obtained, and the mixed liquid was moved to a plastic bottle. The plastic bottle with an airtight stopper was stirred at 2000 $min^{-1}$ (2000 rotations/minute) for 2 minutes by using a planetary centrifugal stirrer (Planetary Vacuum Mixer ARV-310, manufactured by THINKY CORPORATION). The mixed liquid was set to a copper paste 2 for binding.

Preparation Examples 3 to 8

Copper pastes 3 to 8 for binding were respectively obtained as with Preparation Example 1, except that the type of carboxylate was changed, and the added amount of the copper particles and the zinc particles, the added amount of the dispersion medium, and the added amount of the additive were set, as shown in the table.

Preparation Examples 9 to 12

Copper pastes 9 to 12 for binding were respectively obtained as with Preparation Example 1, except that the added amount of the copper particles and the zinc particles, the added amount of the dispersion medium, and the added amount of the additive were set as shown in the table.

Preparation Examples 13 to 25

Copper pastes 13 to 25 for binding were respectively obtained as with Preparation Example 1, except that the type of additive was changed, and the added amount of the copper particles and the zinc particles, the added amount of the dispersion medium, and the added amount of the additive were set, as shown in the table.

Preparation Example 26

A copper paste 26 for binding was obtained as with Preparation Example 1, except that the additive was not blended, and the added amount of the copper particles and the zinc particles and the added amount of the dispersion medium were set as shown in the table.

TABLE 1

| | | Preparation Example 1 | Preparation Example 2 | Preparation Example 3 | Preparation Example 4 | Preparation Example 5 | Preparation Example 6 | Preparation Example 7 | Preparation Example 8 |
|---|---|---|---|---|---|---|---|---|---|
| Flaky microcopper particles | BET specific surface area ($cm^2/g$) | 25900 | 25900 | 25900 | 25900 | 25900 | 25900 | 25900 | 25900 |
| | 50% volume average particle diameter (μm) | 5.4 | 5.4 | 5.4 | 5.4 | 5.4 | 5.4 | 5.4 | 5.4 |
| | Added amount (g) | 2.67 | 1.35 | 1.35 | 2.67 | 1.35 | 1.35 | 1.35 | 1.35 |
| | Mass ratio (mass %) of microcopper particles based on total mass of copper particles | 30 | 30 | 30 | 30 | 30 | 30 | 30 | 30 |

TABLE 1-continued

|  |  | Preparation Example 1 | Preparation Example 2 | Preparation Example 3 | Preparation Example 4 | Preparation Example 5 | Preparation Example 6 | Preparation Example 7 | Preparation Example 8 |
|---|---|---|---|---|---|---|---|---|---|
| Submicro-copper particles | 50% volume average particle diameter (μm) | 0.36 | 0.36 | 0.36 | 0.36 | 0.36 | 0.36 | 0.36 | 0.36 |
|  | Added amount (g) | 6.23 | 3.11 | 3.11 | 6.23 | 3.11 | 3.11 | 3.11 | 3.11 |
|  | Mass ratio (mass %) of submicrocopper particles based on total mass of copper particles | 70 | 70 | 70 | 70 | 70 | 70 | 70 | 70 |
| Zinc particles | Added amount (g) | 0.018 | 0.0088 | 0.0088 | 0.018 | 0.0088 | 0.0088 | 0.0088 | 0.0088 |
| Dispersion medium | Added amount (g) of α-terpineol | 0.77 | 0.38 | 0.32 | 0.77 | 0.35 | 0.38 | 0.38 | 0.35 |
|  | Added amount (g) of tributyrin | 0.33 | 0.17 | 0.17 | 0.33 | 0.17 | 0.17 | 0.17 | 0.17 |
| Additive | Type of additive | Acetic acid | Acetic acid | Butyric acid | Hexanoic acid | Hexanoic acid | Hexanoic acid | Hexanoic acid | Nonanoic acid |
|  | Added amount (g) | 0.0022 | 0.0028 | 0.0028 | 0.0022 | 0.0028 | 0.0044 | 0.0049 | 0.0028 |
|  | Mass ratio (mass %) of additive based on total mass of dispersion medium | 0.2 | 0.5 | 0.5 | 0.2 | 0.5 | 0.8 | 0.9 | 0.5 |

TABLE 2

|  |  | Preparation Example 9 | Preparation Example 10 | Preparation Example 11 | Preparation Example 12 |
|---|---|---|---|---|---|
| Flaky microcopper particles | BET specific surface area (cm²/g) | 25900 | 25900 | 25900 | 25900 |
|  | 50% volume average particle diameter (μm) | 5.4 | 5.4 | 5.4 | 5.4 |
|  | Added amount (g) | 2.67 | 0.801 | 0.801 | 0.801 |
|  | Mass ratio (mass %) of microcopper particles based on total mass of copper particles | 30 | 30 | 30 | 30 |
| Submicrocopper particles | 50% volume average particle diameter (μm) | 0.36 | 0.36 | 0.36 | 0.36 |
|  | Added amount (g) | 6.23 | 1.87 | 1.87 | 1.87 |
|  | Mass ratio (mass %) of submicrocopper particles based on total mass of copper particles | 70 | 70 | 70 | 70 |
| Zinc particles | Added amount (g) | 0.018 | 0.0053 | 0.0053 | 0.0053 |
| Dispersion medium | Added amount (g) of α-terpineol | 0.77 | 0.23 | 0.23 | 0.23 |
|  | Added amount (g) of tributyrin | 0.33 | 0.10 | 0.10 | 0.10 |
| Additive | Type of additive | Acetic acid | Acetic acid | Acetic acid | Acetic acid |
|  | Added amount (g) | 0.0011 | 0.003 | 0.007 | 0.017 |
|  | Mass ratio (mass %) of additive based on total mass of dispersion medium | 0.1 | 1 | 2 | 5 |

TABLE 3

|  |  | Preparation Example 13 | Preparation Example 14 | Preparation Example 15 | Preparation Example 16 | Preparation Example 17 | Preparation Example 18 | Preparation Example 19 |
|---|---|---|---|---|---|---|---|---|
| Flaky microcopper particles | BET specific surface area (cm²/g) | 25900 | 25900 | 25900 | 25900 | 25900 | 25900 | 25900 |
|  | 50% volume average particle diameter (μm) | 5.4 | 5.4 | 5.4 | 5.4 | 5.4 | 5.4 | 5.4 |
|  | Added amount (g) | 1.35 | 0.792 | 1.35 | 0.792 | 1.35 | 0.792 | 1.35 |
|  | Mass ratio (mass %) of microcopper | 30 | 30 | 30 | 30 | 30 | 30 | 30 |

TABLE 3-continued

|  |  | Preparation Example 13 | Preparation Example 14 | Preparation Example 15 | Preparation Example 16 | Preparation Example 17 | Preparation Example 18 | Preparation Example 19 |
|---|---|---|---|---|---|---|---|---|
|  | particles based on total mass of copper particles |  |  |  |  |  |  |  |
| Submicro-copper particles | 50% volume average particle diameter (μm) | 0.36 | 0.36 | 0.36 | 0.36 | 0.36 | 0.36 | 0.36 |
|  | Added amount (g) | 3.11 | 1.87 | 3.11 | 1.87 | 3.11 | 1.87 | 3.11 |
|  | Mass ratio (mass %) of submicrocopper particles based on total mass of copper particles | 70 | 70 | 70 | 70 | 70 | 70 | 70 |
| Zinc particles | Added amount (g) | 0.0088 | 0.0053 | 0.0088 | 0.0053 | 0.0088 | 0.0053 | 0.0088 |
| Dispersion medium | Added amount (g) of α-terpineol | 0.35 | 0.23 | 0.35 | 0.23 | 0.35 | 0.23 | 0.35 |
|  | Added amount (g) of tributyrin | 0.17 | 0.10 | 0.17 | 0.10 | 0.17 | 0.10 | 0.17 |
| Additive | Type of additive | Stearic acid | Stearic acid | Tartaric acid | Tartaric acid | Succinic acid | Succinic acid | 2,2-Bis(hydroxy methyl) propionate |
|  | Added amount (g) | 0.0022 | 0.007 | 0.0022 | 0.007 | 0.0022 | 0.007 | 0.0022 |
|  | Mass ratio (mass %) of additive based on total mass of dispersion medium | 0.2 | 2 | 0.2 | 2 | 0.2 | 2 | 0.2 |

TABLE 4

|  |  | Preparation Example 20 | Preparation Example 21 | Preparation Example 22 | Preparation Example 23 | Preparation Example 24 | Preparation Example 25 | Preparation Example 26 |
|---|---|---|---|---|---|---|---|---|
| Flaky microcopper particles | BET specific surface area (cm²/g) | 25900 | 25900 | 25900 | 25900 | 25900 | 25900 | 25900 |
|  | 50% volume average particle diameter (μm) | 5.4 | 5.4 | 5.4 | 5.4 | 5.4 | 5.4 | 5.4 |
|  | Added amount (g) | 0.792 | 1.34 | 1.34 | 1.34 | 1.34 | 1.34 | 1.34 |
|  | Mass ratio (mass %) of microcopper particles based on total mass of copper particles | 30 | 30 | 30 | 30 | 30 | 30 | 30 |
| Submicro-copper particles | 50% volume average particle diameter (μm) | 0.36 | 0.36 | 0.36 | 0.36 | 0.36 | 0.36 | 0.36 |
|  | Added amount (g) | 1.87 | 3.12 | 3.12 | 3.12 | 3.12 | 3.12 | 3.12 |
|  | Mass ratio (mass %) of submicrocopper particles based on total mass of copper particles | 70 | 70 | 70 | 70 | 70 | 70 | 70 |
| Zinc particles | Added amount (g) | 0.0053 | 0.0088 | 0.0088 | 0.0088 | 0.0088 | 0.0088 | 0.0088 |
| Dispersion medium | Added amount (g) of α-terpineol | 0.23 | 0.35 | 0.35 | 0.35 | 0.35 | 0.35 | 0.38 |
|  | Added amount (g) of tributyrin | 0.10 | 0.17 | 0.17 | 0.17 | 0.17 | 0.17 | 0.17 |
| Additive | Type of additive | 2,2-Bis(hydroxy methyl) propionate | Dodecyl amine | N,N-Dimethyl formamide | Ethyl acetate | Acetonitrile | Water | None |
|  | Added amount (g) | 0.007 | 0.028 | 0.028 | 0.028 | 0.028 | 0.028 | — |
|  | Mass ratio (mass %) of additive based on total mass of dispersion medium | 2 | 5 | 5 | 5 | 5 | 5 | 0 |

<Manufacturing of Thermoelectric Conversion Module>

Examples 1 to 26

A binding body was manufactured by using the copper pastes 1 to 26 for binding, in accordance with the following method. A stainless steel metal mask (Thickness: 200 μm) having a square opening of 2 mm×2 mm in 2 rows 1 column in a position in which a p-type semiconductor or an n-type semiconductor was mounted was placed on a copper plate of 5.5 mm×11.5 mm (Thickness: 0.5 mm), and the copper paste for binding was applied by stencil printing using a metal squeegee. A p-type semiconductor and an n-type semiconductor (Thickness: 400 μm) of 2 mm×2 mm, subjected to a nickel sputtering treatment, were alternately placed on the uppermost surface of the applied copper paste for binding to be in contact with the copper paste for binding, and were lightly pressed with tweezers. Further, another pair of the surface of the p-type semiconductor or the n-type semiconductor on which an electrode was not mounted at this time point and an electrode coated with the copper paste for binding were mounted such that the p-type and the n-type were alternated, and were lightly pressed with tweezers to be a series circuit. Note that, a copper stranded wire for wiring, but not an element, was mounted on start and end points of a thermoelectric conversion module. This was set in a tube furnace (manufactured by AVC Co., LTD.), and argon gas flowed at 3 L/min, and thus, the air was replaced with argon gas. After that, temperature rising was performed for 30 minutes while hydrogen gas flowed at 500 ml/min. After temperature rising, a sintering treatment was performed in a condition where a highest achieving temperature was 225° C. and a highest achieving temperature retention time was 60 minutes, and thus, a binding body was obtained in which the copper plate and the p-type semiconductor or the n-type semiconductor, subjected to the nickel sputtering treatment, were bound together. After sintering, the flow rate of argon gas was changed to 0.3 L/min, cooling was performed, and the binding body was taken out to the air at lower than or equal to 50° C.

According to the method described above, it is possible to reduce the thermal resistance compared to a brazing material, and to obtain a thermoelectric conversion module that is excellent in the power generation performance, by sintering the copper paste for binding, containing the copper particles. In addition, the sintered copper paste for binding is a porous body, and thus, it is possible to reduce a stress that is generated due to a thermal expansion difference between the thermoelectric semiconductor and the electrode. Further, the porous body of the sintered copper paste for binding has shape followability, and thus, even in a case where there is a variation in the length of the thermoelectric semiconductor, it is possible to sufficiently obtain the cohesiveness between the thermoelectric semiconductor and the electrode.

<Measurement of Binding Strength of Binding Body>

A binding strength of the binding body obtained as described above was evaluated in accordance with a die shear strength. The die shear strength of the binding body was measured by pressing a copper block in a horizontal direction at a measurement temperature of a room temperature, a measurement speed of 5 mm/min, and a measurement height of 50 μm, by using a universal bond tester (Royce 650, manufactured by Royce Instruments, Inc.) provided with a load cell (SMS-200K-24200, manufactured by Royce Instruments, Inc.). An average value of values obtained by measuring eight binding bodies was set to the die shear strength.

In the case of using the copper pastes 1 to 8 for binding in which 0.2 mass % to 0.9 mass % of a monovalent carboxylic acid having 1 to 9 carbon atoms were contained on the basis of the total mass of the dispersion medium, a die shear strength of greater than or equal to 15 MPa was obtained even in a case where the highest achieving temperature was 225° C. It is considered that such an effect is obtained by accelerating the volatilization of an organic protective agent of the copper particles with the monovalent carboxylic acid having 1 to 9 carbon atoms.

Note that, in the case of using the copper pastes 9 to 12 for binding in which 0.1 mass % or 1 mass % to 5 mass % of the monovalent carboxylic acid having 1 to 9 carbon atoms were contained on the basis of the total mass of the dispersion medium, in the case of using the copper pastes 13 to 25 for binding in which an additive other than the monovalent carboxylic acid having 1 to 9 carbon atoms was blended, and in the case of using the copper paste 26 for binding in which the additive was not contained, the die shear strength was less than 15 MPa.

INDUSTRIAL APPLICABILITY

According to the present invention, it is possible to provide a method for manufacturing a thermoelectric conversion module in which it is possible to manufacture a thermoelectric conversion module excellent in the power generation performance and the heat stress properties with excellent productivity even in a case where there is a variation in the length of the thermoelectric semiconductor, a thermoelectric conversion module excellent in the power generation performance and the heat stress properties, and a binder for a thermoelectric conversion module used therein.

A thermoelectric conversion system including the thermoelectric conversion module according to the present invention can be preferably used in a small-scale dispersion type power generating system using a waste heat source such as a refuse incinerator or a cogeneration system, and an on-vehicle power generating system using the heat of exhaust gas of a vehicle or the like.

REFERENCE SIGNS LIST

1: p-type semiconductor, 2: n-type semiconductor, 11, 12: electrode, 15, 16: electrode with insulating layer, 21: high (low) temperature side heat source, 22: low (high) temperature side heat source, 31, 32: binding portion, 33: metal diffusion prevention layer, 41: high (low) temperature side insulating layer, 42: low (high) temperature side insulating layer, 101, 102, 103: thermoelectric conversion module.

The invention claimed is:

1. A method for manufacturing a thermoelectric conversion module including a thermoelectric semiconductor part in which a plurality of p-type semiconductors and a plurality of n-type semiconductors are alternately arranged, and a high temperature side electrode bound to a binding surface of the plurality of p-type semiconductors and the plurality of n-type semiconductors on a high temperature heat source side and a low temperature side electrode bound to a binding surface of the plurality of p-type semiconductors and the plurality of n-type semiconductors on a low temperature heat source side, which electrically connect the plurality of p-type semiconductors and the plurality of n-type semiconductors adjacent to each other in series, the method comprising:

a binding step of binding at least one of the high temperature side electrode and the low temperature side electrode, and the plurality of p-type semiconductors and the plurality of n-type semiconductors together, by sintering a binding layer containing metal particles, which is provided between the electrode and the plurality of p-type semiconductors and the plurality of n-type semiconductors, wherein the binding layer is formed of a binder containing metal particles comprising copper particles, the copper particles comprising submicrocopper particles having a volume average particle diameter of greater than or equal to 0.12 μm and less than or equal to 0.8 μm by greater than or equal to 30 mass % and less than or equal to 90 mass % on the basis of a total mass of the metal particles.

2. The method for manufacturing the thermoelectric conversion module according to claim 1, wherein in the binding step, the binding layer is sintered under a load of 0 MPa to 100 MPa.

3. The method for manufacturing the thermoelectric conversion module according to claim 1,
wherein the binding layer is formed of a coating film of the binder having a thickness of 10 μm to 1000 μm.

4. The method for manufacturing the thermoelectric conversion module according to claim 1,
wherein a variation in a length of the plurality of p-type semiconductors and the plurality n-type semiconductors in a current direction before binding is 10 μm to 200 μm.

5. The method for manufacturing the thermoelectric conversion module according to claim 1,
wherein a part or all of at least one surface of the binding surface of the plurality of p-type semiconductors and the plurality of n-type semiconductors with respect to the high temperature side electrode and the low temperature side electrode, and a binding surface of the high temperature side electrode and the low temperature side electrode with respect to the plurality of p-type semiconductors and the plurality of n-type semiconductors includes a metal diffusion prevention layer.

6. The method for manufacturing the thermoelectric conversion module according to claim 1,
wherein the binder further contains a dispersion medium.

7. The method for manufacturing the thermoelectric conversion module according to claim 6,
wherein the binder contains a solvent having a boiling point of higher than or equal to 300° C. by greater than or equal to 2 mass % on the basis of a total mass of the binder or greater than or equal to 15 volume % on the basis of a total volume of the binder, as the dispersion medium.

8. The method for manufacturing the thermoelectric conversion module according to claim 1,
wherein the copper particles further comprise flaky microcopper particles having a volume average particle diameter of greater than or equal to 2 μm and less than or equal to 50 μm and an aspect ratio of greater than or equal to 3.0 by greater than or equal to 10 mass % and less than or equal to 50 mass % on the basis of the total mass of the metal particles.

9. The method for manufacturing the thermoelectric conversion module according to claim 1,
wherein the binder contains other particles in addition to the copper particles, as the metal particles, and the other particles contain at least one type of metal selected from the group consisting of zinc, nickel, silver, gold, palladium, and platinum.

10. The method for manufacturing the thermoelectric conversion module according to claim 1,
wherein a sintered body having a volume resistivity, a heat conductivity, and a binding strength of less than or equal to $1\times10^{-5}$ Ω·cm, greater than or equal to 50 $W\cdot m^{-}\cdot K^{-1}$, and greater than or equal to 20 MPa, respectively, is formed by heating the binding layer at lower than or equal to 350° C. in hydrogen having a concentration of greater than or equal to 1%.

11. The method for manufacturing the thermoelectric conversion module according to claim 1,
wherein the binder contains 0.2 mass % to 0.9 mass % of a monovalent carboxylic acid having 1 to 9 carbon atoms, on the basis of the total mass of the dispersion medium.

12. The method for manufacturing the thermoelectric conversion module according to claim 1,
wherein the binding layer is sintered under a pressure of less than or equal to 0.01 MPa.

13. A method for manufacturing a thermoelectric conversion module including a thermoelectric semiconductor part in which a plurality of p-type semiconductors and a plurality of n-type semiconductors are alternately arranged, and a high temperature side electrode bound to a binding surface of the plurality of p-type semiconductors and the plurality of n-type semiconductors on a high temperature heat source side and a low temperature side electrode bound to a binding surface of the plurality of p-type semiconductors and the plurality of n-type semiconductors on a low temperature heat source side, which electrically connect the plurality of p-type semiconductors and the plurality of n-type semiconductors adjacent to each other in series, the method comprising:
a binding step of binding at least one of the high temperature side electrode and the low temperature side electrode, and the plurality of p-type semiconductors and the plurality of n-type semiconductors together, by sintering a binding layer containing metal particles, which is provided between the electrode and the plurality of p-type semiconductors and the plurality of n-type semiconductors,
wherein the binding layer is formed of a binder containing metal particles comprising copper particles, the copper particles comprising flaky microcopper particles having a volume average particle diameter of greater than or equal to 2 μm and less than or equal to 50 μm and an aspect ratio of greater than or equal to 3.0 by greater than or equal to 10 mass % and less than or equal to 50 mass % on the basis of the total mass of the metal particles.

* * * * *